United States Patent
Park et al.

(10) Patent No.: US 11,387,358 B2
(45) Date of Patent: Jul. 12, 2022

(54) SEMICONDUCTOR STRUCTURE, TRANSISTOR INCLUDING THE SAME, AND METHOD OF MANUFACTURING TRANSISTOR

(71) Applicant: Samsung Electronics Co., Ltd., Suwon-si (KR)

(72) Inventors: Younghwan Park, Seongnam-si (KR); Jongseob Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/931,969

(22) Filed: May 14, 2020

(65) Prior Publication Data
US 2021/0151595 A1    May 20, 2021

(30) Foreign Application Priority Data
Nov. 19, 2019   (KR) .................. 10-2019-0149111

(51) Int. Cl.
*H01L 29/778*    (2006.01)
*H01L 29/06*    (2006.01)
(Continued)

(52) U.S. Cl.
CPC ...... *H01L 29/7788* (2013.01); *H01L 29/0615* (2013.01); *H01L 29/2003* (2013.01);
(Continued)

(58) Field of Classification Search
CPC ............ H01L 29/7813; H01L 29/7825; H01L 29/42336; H01L 29/42352;
(Continued)

(56) References Cited

U.S. PATENT DOCUMENTS 6,075,259 A * 6/2000 Baliga ................ H01L 21/0445
257/77
8,110,870 B2   2/2012 Sugimoto et al.
(Continued)

FOREIGN PATENT DOCUMENTS

EP    1884999 A1   2/2008
EP    2843708 A1   3/2015
(Continued)

OTHER PUBLICATIONS

Extended European Search Report dated Nov. 9, 2020, issued in corresponding European Patent Application No. 20175477.7.
(Continued)

*Primary Examiner* — Shahed Ahmed
(74) *Attorney, Agent, or Firm* — Harness, Dickey & Pierce, P.L.C.

(57) ABSTRACT

A semiconductor structure includes a substrate; at least one mask layer spaced apart from the substrate in a first direction; a first semiconductor region of a first conductivity type between the substrate and the at least one mask layer; a second semiconductor region of a second conductivity type on the at least one mask layer; and a third semiconductor region of the first conductivity type on the first semiconductor region. The third semiconductor region may contact the second semiconductor region to form a PN-junction structure in a second direction different from the first direction. The semiconductor structure may be applied to vertical power devices and may be capable of increasing withstand voltage performance and lowering an on-resistance.

28 Claims, 24 Drawing Sheets

(51) Int. Cl.
  *H01L 29/20* (2006.01)
  *H01L 29/205* (2006.01)
  *H01L 29/66* (2006.01)
  *H01L 29/78* (2006.01)

(52) U.S. Cl.
  CPC ...... *H01L 29/205* (2013.01); *H01L 29/66462* (2013.01); *H01L 29/66727* (2013.01); *H01L 29/66734* (2013.01); *H01L 29/7786* (2013.01); *H01L 29/7812* (2013.01); *H01L 29/7813* (2013.01)

(58) Field of Classification Search
  CPC ......... H01L 29/66613–66628; H01L 29/7828; H01L 29/7783; H01L 29/7801; H01L 21/0337; H01L 29/41766; H01L 29/0649; H01L 29/1095; H01L 29/0623; H01L 29/0646; H01L 29/66734; H01L 29/7786; H01L 29/7812; H01L 29/205; H01L 29/7788; H01L 29/0615; H01L 29/2003
  See application file for complete search history.

(56) References Cited

U.S. PATENT DOCUMENTS

| | | | |
|---|---|---|---|
| 8,716,748 B2 | 5/2014 | Imada et al. | |
| 9,219,137 B2 | 12/2015 | Takeya et al. | |
| 10,201,051 B1 | 2/2019 | Blanchard | |
| 2003/0122222 A1 | 7/2003 | Okumura et al. | |
| 2008/0258695 A1 | 10/2008 | Kumar et al. | |
| 2009/0050932 A1* | 2/2009 | Lu | H01L 29/7395 257/139 |
| 2012/0276701 A1 | 11/2012 | Yedinak et al. | |
| 2013/0221368 A1 | 8/2013 | Oraw | |
| 2014/0034811 A1 | 2/2014 | Cho et al. | |
| 2014/0295652 A1 | 10/2014 | Nie et al. | |
| 2014/0361349 A1* | 12/2014 | Alexandrov | H01L 29/8083 257/263 |
| 2015/0014628 A1 | 1/2015 | Chung | |
| 2015/0137137 A1 | 5/2015 | Chowdhury et al. | |
| 2017/0125574 A1* | 5/2017 | Chowdhury | H01L 29/2003 |
| 2019/0304788 A1 | 10/2019 | Takashima et al. | |

FOREIGN PATENT DOCUMENTS

| | | |
|---|---|---|
| JP | 2010027639 A | 2/2010 |
| JP | 2012119625 A | 6/2012 |
| KR | 20150012020 A | 2/2015 |

OTHER PUBLICATIONS

Tohru Oka, 'Recent development of vertical GaN power devices' *Japanese Journal of Applied Physics*, vol. 58, SB0805, Apr. 2019.

Zhongda Li and T. Paul Chow, 'Robustness of GaN Vertical Superjunction HEMT' *Proceedings of the 25th International Symposium on Power Semiconductor Devices & ICs*, Kanazawa, 2013, pp. 217-220.

* cited by examiner

SEMICONDUCTOR STRUCTURE, TRANSISTOR INCLUDING THE SAME, AND METHOD OF MANUFACTURING TRANSISTOR

CROSS-REFERENCE TO RELATED APPLICATION

This application claims the benefit of Korean Patent Application No. 10-2019-0149111, filed on Nov. 19, 2019, in the Korean Intellectual Property Office, the disclosure of which is incorporated herein in its entirety by reference.

BACKGROUND

1. Field

Embodiments set forth herein relate to a semiconductor structure, a transistor including the same, and a method of manufacturing the transistor.

2. Description of Related Art

The role of a power switching device is important in a power conversion system that receives main power and converts the main power into a voltage for a plurality of devices or distributes the main power to the plurality of devices. The power switching device may be embodied as a transistor based on a semiconductor material, such as silicon, GaN, or SiC, e.g., a metal oxide semiconductor field effect transistor (MOSFET). Such a power switching device may be required to have a high breakdown voltage, and much research has been conducted to reduce an on-resistance and obtain high integration and fast switching characteristics.

Generally, an n-type doped GaN epitaxial layer is used in vertical GaN power devices, which are currently being developed by various companies and academia, to make vertical channels and drift regions. In this case, a channel should be long to increase a voltage that the device should withstand. However, when the channel is long, an on-resistance is high. In addition, in order to increase a length of the channel, a GaN epitaxial layer should be formed to a large thickness but when GaN is grown to a thick thickness on a heterogeneous substrate, warpage, defects, breakage, etc. may occur due to a lattice constant difference. When a homogeneous GaN substrate is used, costs are very high and a wafer size is small, and thus productivity may be low.

SUMMARY

Provided is a semiconductor structure applicable to a vertical power device.

Provided is also a vertical power device in which the semiconductor structure is used to lower an on-resistance and improve withstanding voltage.

Additional aspects will be set forth in part in the description which follows and, in part, will be apparent from the description, or may be learned by practice of the presented embodiments of the disclosure.

According to an aspect of an embodiment, a semiconductor structure includes a substrate; at least one mask layer spaced apart from the substrate in a first direction; a first semiconductor region of a first conductivity type between the substrate and the at least one mask layer; a second semiconductor region of a second conductivity type on the at least one mask layer; and a third semiconductor region of the first conductivity type on the first semiconductor region, the third semiconductor region contacting the second semiconductor region to form a PN-junction structure in a second direction different from the first direction.

In some embodiments, the third semiconductor region may extend in the first direction from a region of a surface of the first semiconductor region not covered with the at least one mask layer toward an upper region of the at least one mask layer.

In some embodiments, the second semiconductor region may contact the at least one mask layer.

In some embodiments, the at least one mask layer may include an insulating material that is configured to limit and/or suppresses growth of a semiconductor.

In some embodiments, the semiconductor structure may further include a high-concentration layer between the substrate and the first semiconductor region. The high-concentration layer may be doped more heavily than the first semiconductor region.

In some embodiments, the first semiconductor region, the second semiconductor region, and the third semiconductor region may include a Group III-V compound semiconductor. The Group III may include at least one element of boron (B), aluminum (Al), gallium (Ga), or indium (In). The Group V may include nitrogen.

In some embodiments, the first semiconductor region and the third semiconductor region may be formed of a compound semiconductor of a same composition.

According to another aspect of an embodiment, a transistor includes a drain electrode; at least one mask layer spaced apart from the drain electrode in a first direction; a first drift region of a first conductivity type between the drain electrode and the at least one mask layer; a channel region of a second conductivity type on the at least one mask layer; a second drift region on the first drift region and the second direct region contacting the channel region to form a PN-junction structure in a second direction different from the first direction; a source electrode on the channel region; and a gate electrode on the second drift region.

In some embodiments, the channel region may extend in the first direction toward an upper region of the at least one mask layer, from a region of a surface of the first drift region not covered with the at least one mask layer.

In some embodiments, the channel region may contact the at least one mask layer.

In some embodiments, the at least one mask layer may include an insulating material that is configured to limit and/or suppress growth of a semiconductor.

In some embodiments, the transistor may further include a drain region between the drain electrode and the first drift region. The drain region may be doped with a dopant of a first conductivity type at a high concentration.

In some embodiments, the drain region may directly contact the first drift region.

In some embodiments, the first drift region, the channel region, and the second drift region may include a Group III-V compound semiconductor. The Group III-V compound semiconductor may include at least one element of boron (B), aluminum (Al), gallium (Ga), or indium (In) as a Group III element. The Group III-V compound semiconductor may include nitrogen as a Group V element.

In some embodiments, the source electrode may directly contact the channel region.

In some embodiments, the transistor may further include a source region between the channel region and the source electrode. The source region may be doped with a dopant of a first conductivity type at a high concentration.

In some embodiments, the source electrode may be in a shape in which one end region thereof passes through the source region and directly contacts the channel region.

In some embodiments, the source electrode may be in a shape in which one end region thereof passes through the source region and extends into the channel region.

In some embodiments, the gate electrode may be adjacent to the channel region and the second drift region, and the transistor may further include a gate insulating film surrounding the gate electrode to insulate the gate electrode from the channel region and the second drift region.

In some embodiments, the transistor may further include a two-dimensional electron gas (2DEG) induction layer configured to induce a two-dimensional electron gas layer in the second drift region. The 2DEG induction layer may be between the second drift region and the source electrode and may be formed of a semiconductor material of a composition different from that of a semiconductor material of the second drift region.

In some embodiments, the source electrode may be in a shape in which one end region thereof passes through the 2DEG induction layer to directly contact the channel region.

In some embodiments, the source electrode may be in a shape in which one end region thereof passes through the 2DEG induction layer to extend into the channel region.

In some embodiments, a thickness of the second drift region may be greater than a thickness of the first drift region.

According to another aspect of an embodiment, a method of manufacturing a transistor includes forming a first drift region of a first conductivity type on a substrate; forming at least one mask layer on the first drift region; forming a second drift region by growing a semiconductor from a region of a surface of the first drift region not covered with the at least one mask layer; forming a channel region of a second conductivity type on the at least one mask layer; forming a source electrode on the channel region; forming a gate electrode on the second drift region; and forming a drain electrode below the first drift region.

In some embodiments, the method may further include, before forming the first drift region on the substrate, forming a drain region doped with a dopant of the first conductivity type dopant at a high concentration on the substrate.

In some embodiments, the forming the first drift region may include forming the first drift region drain in direct contact with the drain region.

In some embodiments, the forming the channel region may include forming the channel region to cover an entire region of the surface of the first drift region not covered with the at least one mask layer.

In some embodiments, the forming the source electrode may include forming the source electrode in direct contact with the channel region.

According to an aspect of an embodiment, a semiconductor structure includes a substrate; a first semiconductor region of a first conductivity type on the substrate; a plurality of mask layers spaced apart from each other on the first semiconductor region; a second semiconductor region of a second conductivity type on the plurality on the plurality of mask layers; and a third semiconductor region of the first conductivity type on the first semiconductor region. The second conductivity type is different than the first conductivity type. The third semiconductor region contacts the second semiconductor region to form a PN-junction structure in a direction parallel to an upper surface of the substrate.

In some embodiments, a transistor may include the semiconductor structure; a two-dimensional electron gas (2DEG) induction layer over the second semiconductor region and the third semiconductor region; a source electrode extending through the 2DEG induction layer and electrically connecting to the second semiconductor region; and a gate electrode on the 2DEG induction layer. The gate electrode may be spaced apart from the source electrode. The substrate may be a drain electrode.

In some embodiments, a transistor may include the semiconductor structure; a gate electrode on the third semiconductor region; a gate insulating layer between the gate electrode and the third semiconductor region; and a source electrode electrically connected to the second semiconductor region. The source electrode may be spaced apart from the gate electrode and the substrate may be a drain electrode.

In some embodiments, the first semiconductor region, the second semiconductor region, and the third semiconductor region may include a Group III-V compound semiconductor. The Group III-V compound semiconductor may include at least one element of boron (B), aluminum (Al), gallium (Ga), or indium (In) as a Group III, element. The Group III-V compound semiconductor may include nitrogen as a Group V element.

In some embodiments, an electronic device may include the semiconductor structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
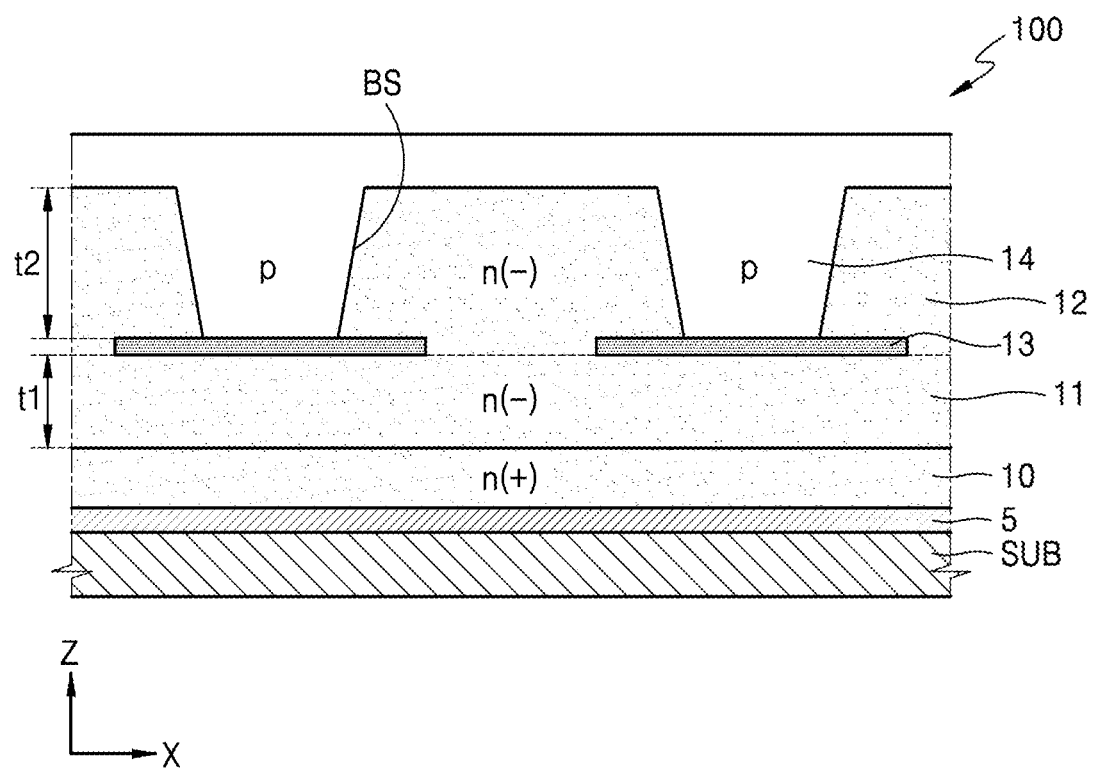
FIG. 1 is a schematic cross-sectional view illustrating a structure of a semiconductor structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C.

Hereinafter, embodiments will be described in detail with reference to the accompanying drawings. Embodiments described below are merely examples and various modifications may be made therein. In the drawings, like reference numerals refer to like elements, and the size of each element may be exaggerated for clarity and convenience of description.

As used herein, the term "on" or "above" an element may be understood to mean that the element can be directly on another element or be on another element not in contact with the other element.

The terms 'first', 'second,' etc. may be used to describe various elements but are only used herein to distinguish one element from another element. These terms are not intended to limit materials or structures of elements.

As used herein, the singular expressions are intended to include plural forms as well, unless the context clearly dictates otherwise. It will be understood that when an element is referred to as "including" another element, the element may further include other elements unless mentioned otherwise.

Terms such as "unit", "module," and the like, when used herein, represent units for processing at least one function or operation, which may be implemented by hardware, software, or a combination of hardware and software.

The terms "the" and "a" and demonstratives similar thereto may be understood to include both singular and plural forms.

Unless explicitly stated that operations of a method should be performed in an order described below, the operations may be performed in an appropriate order. In addition, all terms indicating examples (e.g., etc.) are only for the purpose of describing technical ideas in detail, and thus the scope of the present disclosure is not limited by these terms unless limited by the claims.

The term "region" may refer to a layer, a substrate, or other structural feature, or portion thereof, depending on the context.

FIG. 1 is a schematic cross-sectional view illustrating a structure of a semiconductor structure according to an embodiment.

Referring to FIG. 1, a semiconductor structure 100 includes a substrate SUB, a first semiconductor region 11 on the substrate SUB, at least one mask layer 13 on the first semiconductor region 11, and second semiconductor regions 14 on the at least one mask layer 13 and third semiconductor regions 12 on the first semiconductor region 11. A buffer layer 5 may be provided between the substrate SUB and the first semiconductor region 11.

A sapphire ($Al_2O_3$) substrate, a silicon (Si) substrate, a silicon carbide (SiC) substrate, a metal substrate, a GaN substrate, or the like may be used as the substrate SUB.

The buffer layer 5 is employed to mitigate occurrence of defects, cracks, stress, etc. due to a lattice constant mismatch or a thermal expansion coefficient mismatch between semiconductor materials of the substrate SUB and the first semiconductor region 11 and to obtain a high-quality semiconductor layer.

For example, when the substrate SUB is a silicon substrate and the first semiconductor region 11 includes GaN, thermal tensile stress may be applied to a nitride semiconductor thin film during cooling due to a difference in thermal expansion coefficient between Si and GaN and thus the substrate SUB may warp, when a GaN thin film is grown directly on the silicon substrate. Cracks may occur when the thermal tensile stress exceeds a critical point. In addition, a defect may occur due to a lattice constant difference.

The buffer layer 5 is illustrated as a single layer but is not limited thereto and may have a multilayer structure. A material and structure of the buffer layer 5 may be determined in consideration of a material of the substrate SUB and the semiconductor material used to form the first semiconductor region 11.

The first semiconductor region 11 may be a semiconductor layer doped with a dopant of a first conductivity type. The first conductivity type may be n type. The first semiconductor region 11 may include a Group III-V compound semiconductor. The first semiconductor region 11 may include at least one element of boron (B), aluminum (Al), gallium (Ga), or indium (In) as a Group III element, and include a nitride semiconductor containing a nitrogen element as a Group V element. The first semiconductor region 11 may include n-type GaN.

The mask layer 13 is formed on the first semiconductor region 11. The mask layer 13 may include an insulating material that limits and/or suppresses growth of a semiconductor, and may include, for example, various types of oxides and nitrides. The mask layer 13 may include $SiO_2$ or $SiN_x$.

The mask layer 13 is spaced apart from the substrate SUB in a first direction (a Z-axis direction) and covers part of a surface of the first semiconductor region 11 to form a PN-junction structure on the first semiconductor region 11 in a second direction different from the first direction. The second direction may be an X-axis direction. A semiconductor structure may be formed in a desired shape by growing a semiconductor on a region of the surface of the first semiconductor region 11, which is not covered with the mask layer 13, and growing a semiconductor on the mask layer 13. Two mask layers 13 are illustrated, but this is only an example, and the number of mask layers 13 may be one or more than two.

The second semiconductor region 14 may be on the mask layer 13. The second semiconductor region 14 may be a semiconductor layer doped with a dopant of the second conductivity type. The second conductivity type may be p type. The second semiconductor region 14 may include a Group III-V compound semiconductor. The second semiconductor region 14 may include at least one element of boron (B), aluminum (Al), gallium (Ga), or indium (In) as a Group III element, and include a nitride semiconductor containing a nitrogen element as a Group V element. The second semiconductor region 14 may include p-type GaN.

The third semiconductor region 12 is on the first semiconductor region 11. Like the first semiconductor region 11, the third semiconductor region 12 may be a semiconductor layer doped with a dopant of a first conductivity type. The first conductivity type may be n type. The third semiconductor region 12 may include a semiconductor having the same composition as the first semiconductor region 11. The third semiconductor region 12 may include a Group III-V compound semiconductor. The third semiconductor region 12 may include at least one element of boron (B), aluminum (Al), gallium (Ga), or indium (In) as a Group III element, and include a nitride semiconductor containing a nitrogen element as a Group V element. The third semiconductor region 12 may include n-type GaN.

As shown in the drawing, the third semiconductor region 12 may have a shape extending in the first direction (the Z-axis direction) from a region of the surface of the first semiconductor region 11, which is not covered with the at least one mask layer 13, toward an upper region of the mask layer 13. This is because a semiconductor is grown not only in the first direction, which is a growth direction, but also in the second direction parallel to the first direction when the semiconductor is grown from the region of the surface of the first semiconductor region 11 not covered with the at least one mask layer 13. Thus, a boundary surface BS is provided obliquely on the mask layer 13 and becomes a PN-junction surface. However, the shape of the boundary surface BS shown is only an example and may be more gently or steeply inclined with respect to the mask layer 13.

A thickness t2 of the third semiconductor region 12 may be greater than a thickness t1 of the first semiconductor region 11. The thickness difference is set to further increase an effect of increasing withstanding voltage due to the above-described PN-junction surface when the semiconductor structure 100 is employed, for example, in a vertical transistor, as will be described with reference to FIGS. 2, 3A and 3B below.

The semiconductor structure 100 may further include a high-concentration layer 10 provided between the substrate SUB and the first semiconductor region 11 and more heavily doped than the first semiconductor region 11. The high-concentration layer 10 may include a semiconductor doped with the dopant of the first conductivity type, similar to the first semiconductor region 11. The high-concentration layer 10 may be formed in direct contact with the first semiconductor region 11. The high-concentration layer 10 may include GaN.

The semiconductor structure 100 is applicable to various types of electronic devices and may be processed in various shapes. For example, the semiconductor structure 100 may be available as an electrode when a material of the substrate SUB is a metal, and the substrate SUB may be removed from the semiconductor structure 100 and an electrode may be formed on a lower surface of the high-concentration layer 10 when the material of the substrate SUB is a non-metal. In addition, the second semiconductor region 14 is illustrated as having a shape such that semiconductor materials applied onto the two mask layers 13 spaced apart from each other are merged together in an upward direction. However, the shape is just an example and the shape may be varied according to shapes of gate electrode and source electrode to be formed on the second semiconductor region 14.

Embodiments of various electronic devices using the above-described structure will be described below.

Figure 2:
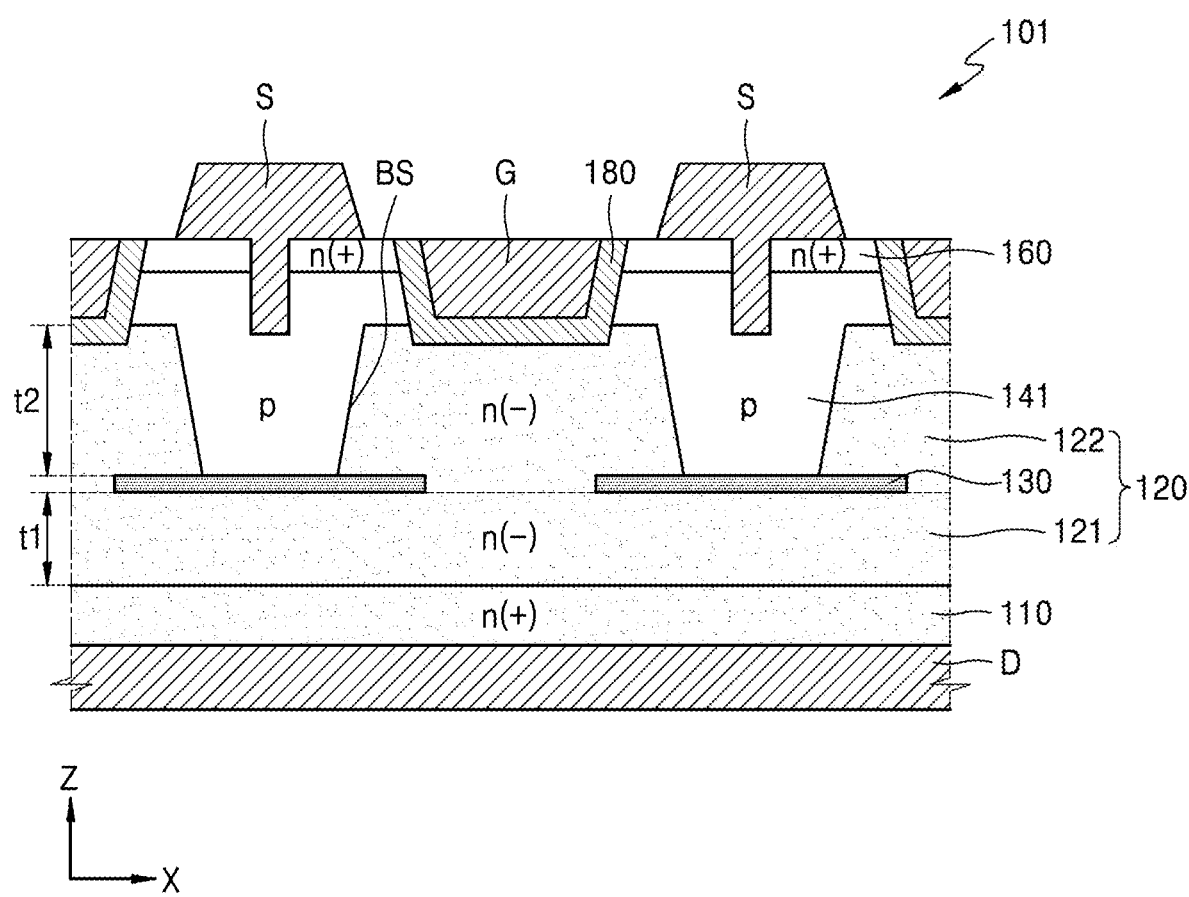
FIG. 2 is a schematic cross-sectional view illustrating a structure of a transistor according to an embodiment.
Figure 3A:
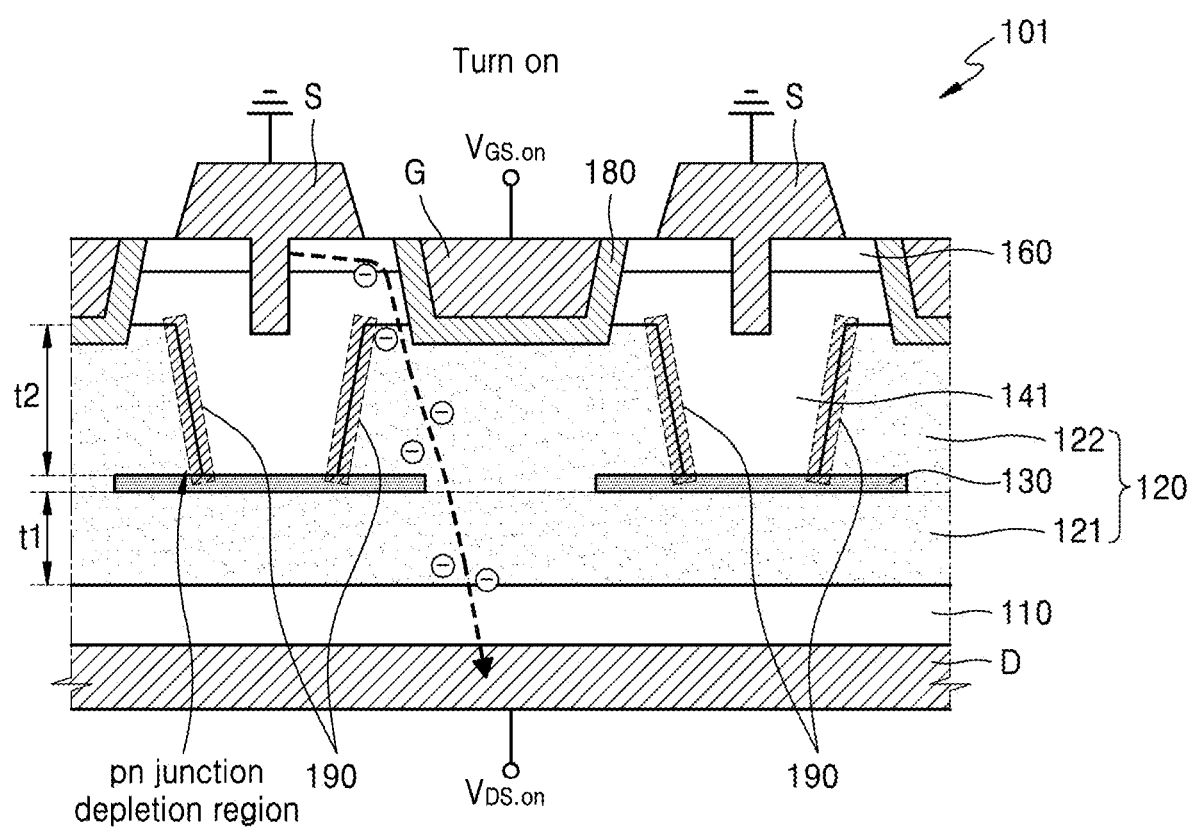
FIGS. 3A and 3B are diagrams comparing a change in a depletion region when the transistor of FIG. 2 is turned on and when the transistor is turned off.
Figure 3B:
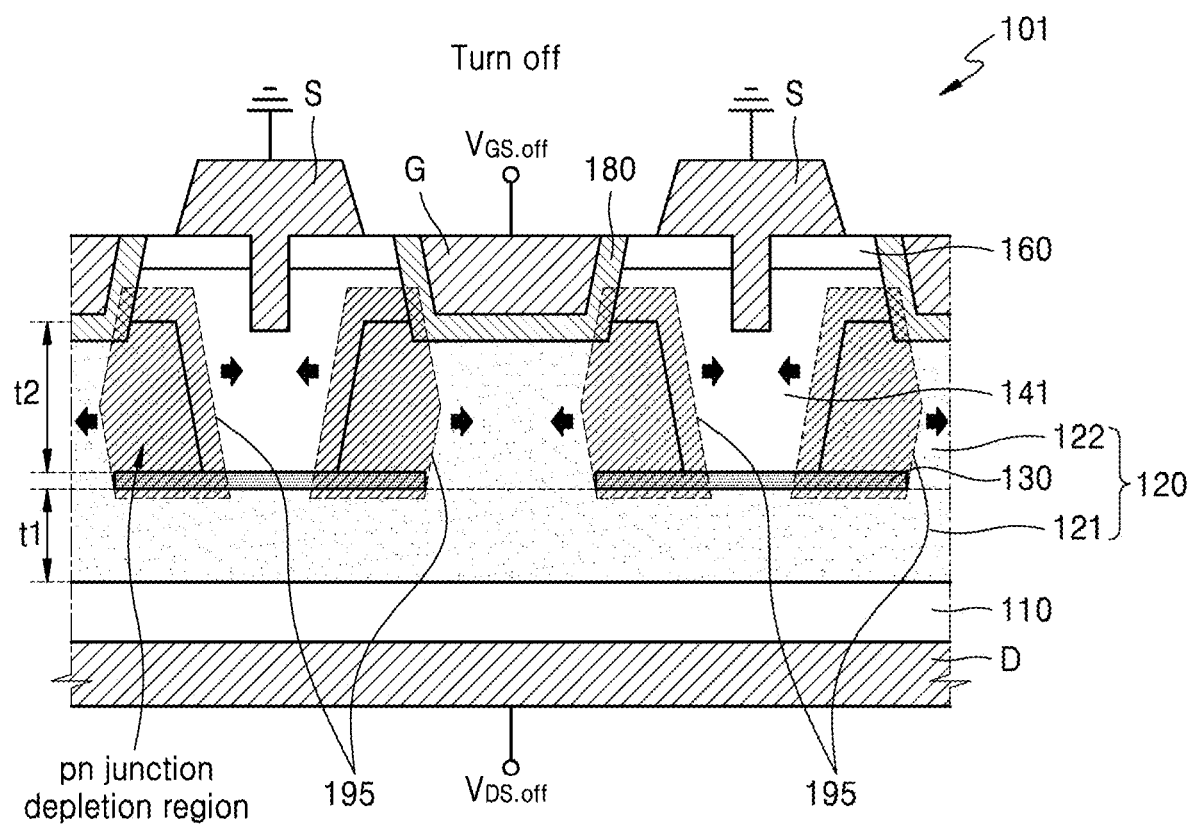

FIG. 2 is a schematic cross-sectional view illustrating a structure of a transistor according to an embodiment. FIGS. 3A and 3B are diagrams comparing a change in a depletion region when the transistor of FIG. 2 is turned on and when the transistor is turned off.

A transistor 101 according to an embodiment is a field-effect transistor, and may be a high power transistor applicable as a power switching element, particularly, a high-power metal oxide semiconductor field-effect transistor (MOSFET). In one embodiment, the transistor 101 employs a structure in which a PN-junction structure is formed in a direction perpendicular to a direction in which a source electrode S and a drain electrode D are spaced apart from each other so as to secure withstanding voltage characteristics to withstand high voltages while lowering an on-resistance Ron.

The structure of the transistor 101 will be described in detail below.

The transistor 101 includes the drain electrode D, at least one mask layer 130 disposed apart from the drain electrode D in a first direction (a Z-axis direction, a first drift region 121 of a first conductivity type between the drain electrode D and the mask layer 130, a channel region 141 of a second conductivity type on the mask layer 130, a second drift region 122 provided on the first drift region 121 to be adjacent to the channel region 141, the source electrode S on the channel region 141, and a gate electrode G on the second drift region 122.

In addition, a drain region 110 doped with a dopant of a first conductivity type in a high concentration may be further provided between the drain electrode D and the first drift region 121, and a source region 160 doped with a dopant of a first conductivity type in a high concentration may be further provided between the source electrode S and the channel region 141.

The first drift region 121 may include a Group III-V compound semiconductor doped with a dopant of a first conductivity type. The first drift region 121 may include, for example, n (−) GaN or n (−) AlGaN. For example, silicon (Si) may be used as the n-type dopant.

A doping concentration and thickness of the first drift region 121 are major factors in terms of the on-resistance Ron and withstand voltage performance of the transistor 101. In order to increase the withstand voltage performance, the thickness of the first drift region 121 may be increased and the doping concentration thereof may be reduced. However, generally, manufacturing the first drift region 121 to a large thickness is limited due to defects or the like occurring in a process of forming a nitride semiconductor on a heterogeneous substrate. In addition, a reduction in the doping concentration of the first drift region 121 results in an increase in the on-resistance Ron and thus the doping concentration may be set in consideration of the on-resistance Ron and the withstand voltage performance.

The at least one mask layer 130 is formed on the first drift region 121. The at least one mask layer 130 may include an insulating material that limits and/or suppresses growth of a semiconductor, and may include, for example, various types of oxides and nitrides. The at least one mask layer 130 may include $SiO_2$ or $SiN_x$.

The at least one mask layer 130 is spaced apart from a substrate SUB in a first direction (a Z-axis direction) and covers part of a surface of the first drift region 121 to form a PN-junction structure on the first drift region 121 in a second direction different from the first direction. The second direction may be an X-axis direction. A semiconductor structure may be formed in a desired shape by growing a semiconductor from a region of the surface of the first drift region 121, which is not covered with the mask layer 130, and growing a semiconductor on the mask layer 130. Two mask layers 130 are illustrated, but this is only an example, and the number of mask layers 130 may be one or more than two.

The channel region 141 is on the at least one mask layer 130. The channel region 141 may include a Group III-V compound semiconductor doped with a dopant of a second conductivity type. The channel region 141 may include, for example, p-type GaN. Alternatively, the channel region 141 may include p-type AlGaN, BAlGaN, BAlInGaN, InGaN, or BInGaN. For example, magnesium Mg may be used as a p type dopant.

The second drift region 122 is on the first drift region 121. The second drift region 122 forms a drift region 120, together with the first drift region 121. The second drift region 122 may include a Group III-V compound semiconductor doped with a dopant of a first conductivity type, similar to the first drift region 121. The second drift region 122 may include a semiconductor having the same composition as the first drift region 121. The second drift region 122 may include, for example, n-GaN.

As shown in the drawing, the second drift region 122 may have a shape extending in the first direction (the Z-axis direction) from a region of the surface of the first drift region 121 not covered with the mask layer 130 toward an upper region of the mask layer 13. This is because a semiconductor is grown not only in the first direction which is a growth direction but also in the second direction parallel to the first direction when the semiconductor is grown from the region of the surface of the first drift region 121 not covered with the mask layer 13. Thus, a boundary surface BS is provided obliquely on the mask layer 130 and becomes a PN-junction surface. However, the shape of the boundary surface BS shown is only an example and may be more gently or steeply inclined with respect to the mask layer 130.

As described above, the channel region 141 and the second drift region 122 form a PN-junction structure in an X-axis direction through growth of a semiconductor utilizing the mask layer 130. As illustrated in FIGS. 3A and 3B, the PN junction structure in a horizontal direction may form depletion regions 190 and 195 to improve withstand voltage performance. This will be described later.

The source electrode S is on the channel region 141 and may be formed to be in direct contact with the channel region 141. The source electrode S may have a shape in which one end region thereof passes through the source region 160 to be in direct contact with the channel region 141. As illustrated in the drawing, the source electrode S may have a shape in which one end region thereof passes through the source region 160 to extend to the inside of the channel region 141.

The gate electrode G is disposed on the second drift region 122 adjacent to the channel region 141. A gate insulating film 180 surrounding the gate electrode G may be further provided to insulate the gate electrode G from the channel region 141 and the second drift region 122.

The source region 160 between the channel region 141 and the source electrode S may include a semiconductor doped with a dopant of a first conductivity type. The source region 160 may be more heavily doped than the channel region 141. The source region 160 may include n (+) GaN, n (+) AlGaN, n (+) BAlGaN, n (+) BAlInGaN, n (+) InGaN, or n (+) BInGaN.

The drain region 110 between the drain electrode D and the first drift region 121 may include a semiconductor doped with a dopant of a first conductivity type. The drain region 110 may be formed in direct contact with the first drift region 121. The drain region 110 may be more heavily doped than the first drift region 121. The drain region 110 may include n (+) GaN or n (+) AlGaN.

The gate electrode G, the drain electrode D, and the source electrode S may be formed of a conductive material. For example, materials of the gate electrode G, the drain electrode D, and the source electrode S may include a metal, an alloy, a conductive metal oxide, or a conductive metal nitride.

The gate electrode G may be formed by forming a trench by vertically penetrating the source region 160 and the channel region 141 by etching to expose part of the second drift region 122 to the outside, forming the gate insulating film 180 on a bottom surface and inner walls of the trench, and filling the inside of the trench with a conductive material. Therefore, both sides of the gate electrode G may face a side of the source region 160 and a side of the channel region 141. In addition, a lower surface of the gate insulating film 180 may be in contact with the second drift region 122, and a portion of a lateral side thereof may be also in contact with the second drift region 122. The gate insulating film 180 may be formed of silicon nitride (SiN), silicon oxide ($SiO_2$), silicon oxynitride (SiON), aluminum nitride (AlN), aluminum oxide ($Al_2O_3$), aluminum oxynitride (AlON), tantalum oxide (($HfO_2$), hafnium oxide ($HfO_2$) or other various high-K dielectric materials.

In order to allow current to flow between the source region 160 and the drain region 110 when a voltage is applied to the gate electrode G, the drain region 110, the first drift region 121, the second drift region 122 and the source region 160 may be doped to have the same electrical polarity. For example, the drain region 110, the first drift region 121, the second drift region 122 and the source region 160 may all be doped with an n-type dopant. Among these, the drain region 110 and the source region 160 may be heavily doped. The drain region 110 and the source region 160 may be doped as n (+).

The first drift region 121 and the second drift region 122 may be doped as n (−) of lower concentration than n (+) to have withstanding voltage characteristics to withstand high voltages. However, as described above, it should be noted that the on-resistance Ron of the transistor 101 decreases when doping concentrations of the first and second drift regions 121 and 122 are lowered.

In one embodiment, the transistor 101 has a structure for improvement of withstand voltage performance, in which a PN-junction structure is formed by the channel region 141 and the second drift region 122 in a horizontal direction (an X-axis direction), e.g., a direction perpendicular to a direction in which the source electrode S and the drain electrode D are spaced apart from each other (a Z-axis direction). Thus, the n-type doping concentrations of the first drift region 121 and the second drift region 122 may be higher than a case that a PN-junction structure is not provided.

For example, the drain region 110 and the source region 160 may be doped in a doping concentration of $10^{19}/cm^3$ or more, and the first drift region 121 and the second drift region 122 may be doped in a doping concentration of $10^{15}/cm^3$ to $10^{18}/cm^3$.

A thickness t2 of the second drift region 122 may be greater than a thickness t1 of the first drift region 121. Here, the thickness t2 of the second drift region 122 refers to the distance from an upper surface of the mask layer 130 to an uppermost end of the boundary surface BS. Because the first drift region 121 and the second drift region 122 are major factors of the on-resistance Ron and withstand voltage performance, the difference between the thicknesses of the first and second regions 121 and 122 should not be understood to mean that the greater the thickness t2 of the second drift region 122 is, the better. It should be understood that a ratio of the thickness t2 of the second drift region 122 to a total thickness set for the first drift region 121 and the second drift region 122 is higher than a ratio of the thickness t1 of the first drift region 121 to the total thickness. The thickness t1 of the first drift region 121 may be reduced and/or minimized within a range suitable for forming the at least one mask layer 130 and forming a PN-junction structure on the at least one mask layer 130.

Unlike in the embodiment, in a case of a transistor having no PN-junction structure in the horizontal direction, a doping concentration of a drift region is generally set not to exceed $10^{17}/cm^3$, thus increasing an on-resistance Ron.

In other words, a transistor of an embodiment employs a structure for increasing a doping concentration of a drift region with respect to a given thickness and withstanding voltage requirements of the drift region, thereby effectively reducing the on-resistance Ron.

Referring to FIGS. 3A and 3B, a state in which a transistor 101 is turned on and a state in which the transistor 101 is turned off will be described.

FIG. 3A illustrates a state in which the transistor 101 is turned on, e.g., a state in which a turn-on voltage is applied to a gate electrode G. A channel path is formed, including a source electrode S, a channel region 141, a first drift region 121, a second drift region 122, a drain region 110, and a drain electrode D.

According to an arrangement in which the source electrode S is in direct contact with the channel region 141, a channel path between the source electrode S and the drain electrode D is formed such that charge carriers pass through a p-type region, a pn junction, and an n-type region.

FIG. 3B illustrates a state in which the transistor 101 is turned off, e.g., a state in which a voltage lower than the turn-on voltage is applied to the gate electrode G. Accordingly, when a voltage of a lower n-type drift region 120 is increased due to a high voltage of the drain electrode D, a reverse voltage is applied to the PN junction. In this case, a depletion region 190 illustrated in FIG. 3A is widened similar to a depletion region 195 of FIG. 3B, and charge carriers may be effectively depleted. Due to the phenomenon, even when a doping concentration of the drift region 120 is high, current may be effectively suppressed under a high voltage.

In addition, a thickness t2 of the second drift region 122 in which a depletion region is formed is set to be greater than a thickness t1 of the first drift region 121, an effect of limiting and/or suppressing current under a high voltage may be further improved.

As described above, withstanding voltage may be increased due to a horizontal PN junction structure and thus a doping concentration of the drift region 120 may be increased without lowering withstand voltage performance, thereby lowering an on-resistance Ron.

The above-described structure of the transistor 101 is a structure called a trench MOSFET, and the concept of an embodiment in which withstanding voltage is increased and the on-resistance Ron is lowered is applicable to various types of vertical transistors, as well as the above structure. For example, the transistor 101 is applicable to transistors such as a high electron mobility transistor (HEMT), a current-aperture vertical electron transistor (CAVET), and a Fin-field-effect transistor (Fin FET).

Figure 4:
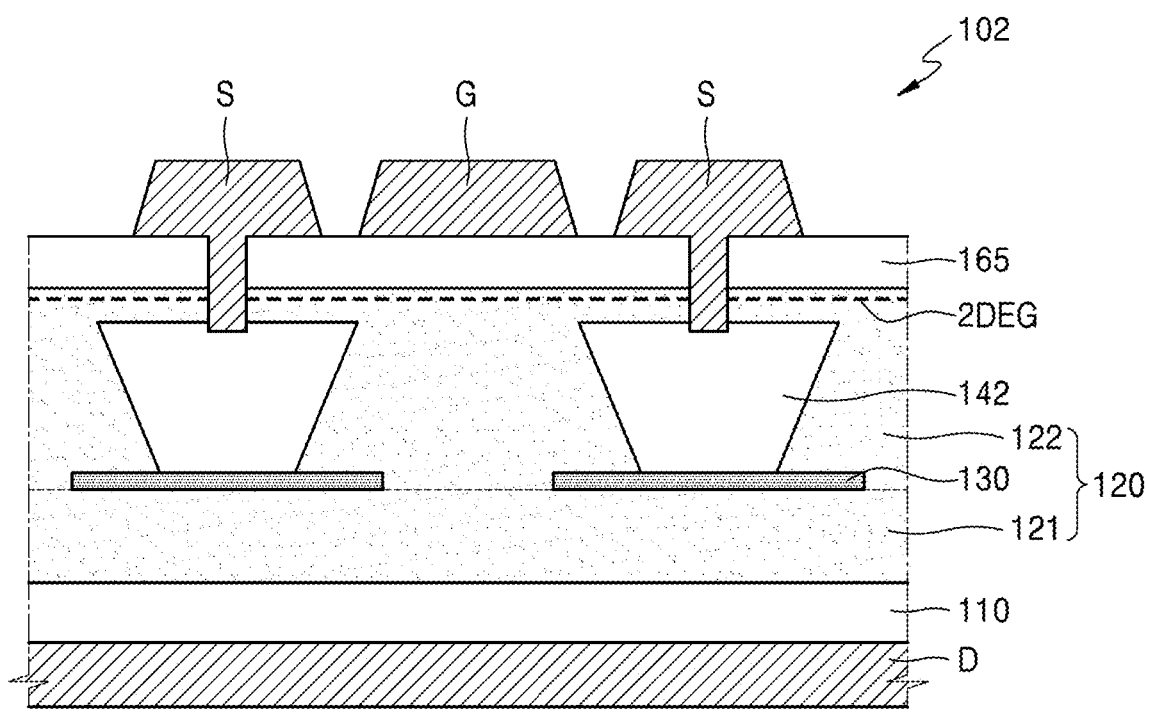
FIG. 4 is a schematic cross-sectional view illustrating a structure of a transistor according to another embodiment.

FIG. 4 is a schematic cross-sectional view illustrating a structure of a transistor according to another embodiment.

A transistor 102 according to the present embodiment is, for example, a high electron mobility transistor (HEMT), and is different from the above-described transistor 101 mainly in that a two-dimensional electron gas (2DEG) induction layer 165 is provided.

The transistor 102 includes a drain electrode D, at least one mask layer 130 disposed apart from the drain electrode D in a first direction (a Z-axis direction, a first drift region 121 of a first conductivity type between the drain electrode D and the at least one mask layer 130, a channel region 142 of a second conductivity type on the at least one mask layer 130, a second drift region 122 provided on the first drift region 121 to be adjacent to the channel region 142, a source electrode S on the channel region 142, and a gate electrode G on the second drift region 122. A drain region 110 doped with a dopant of a first conductivity type in a high concentration may be further provided between the drain electrode D and the first drift region 121.

On the second drift region 122, there is provided the 2DEG induction layer 165 formed of a semiconductor material having a different composition than that of a semiconductor material of the second drift region 122 and inducing a 2DEG layer to the second drift region 122. The 2DEG induction layer 165 may be formed to be in contact with the second drift region 122, and a source electrode S and a drain electrode D are on the 2DEG induction layer 165.

One end region of the source electrode S may pass through the 2DEG induction layer 165 to be in directly contact with the channel region 141. As illustrated in the drawing, the source electrode S may have a shape in which one end region thereof passes through the 2DEG induction layer 165 to extend to the inside of the channel region 141.

The 2DEG induction layer 165 is on the second drift region 122 and is formed of a material capable of inducing a 2DEG layer into the second drift region 122. The 2DEG induction layer 165 may include a Group III-V semiconductor. For example, the 2DEG induction layer 165 may include AlGaN, AlInN, or the like. AlGaN, AlInN, and the like have higher polarizability than that of the second drift region 122 and thus may induce a 2DEG layer into the second drift region 122. When the second drift region 122 is a GaN layer, the 2DEG induction layer 165 may be an AlGaN layer or an AlInN layer. When the second drift region 122 is an InN layer, the 2DEG induction layer 165 may be an AlInN layer. The 2DEG induction layer 165 may be a layer doped with n-type impurities. The 2DEG induction layer 165 may have a multilayer structure including a plurality of different material layers. The 2DEG induction layer 165 may be formed of various other materials, as well as the above examples.

The 2DEG layer formed in the second drift region 122 by the 2DEG induction layer 165 may have a high electron concentration.

Figure 21:
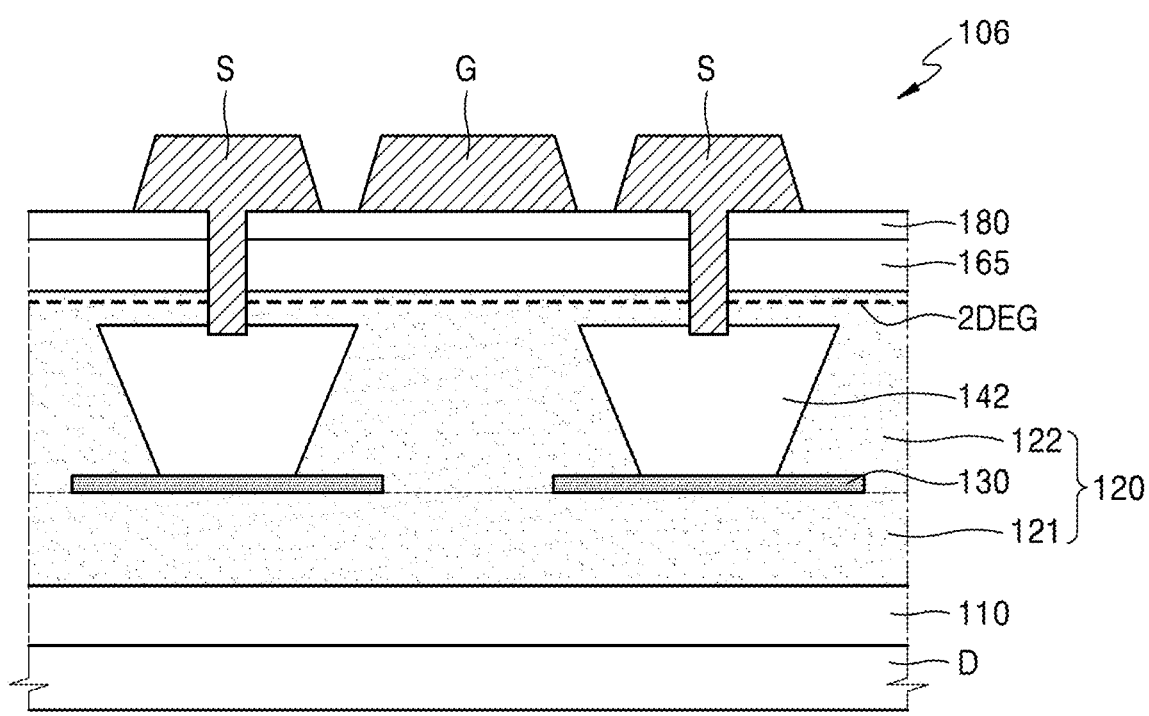
FIG. 21 is a schematic cross-sectional view illustrating a structure of a transistor according to another embodiment.
Figure 22:
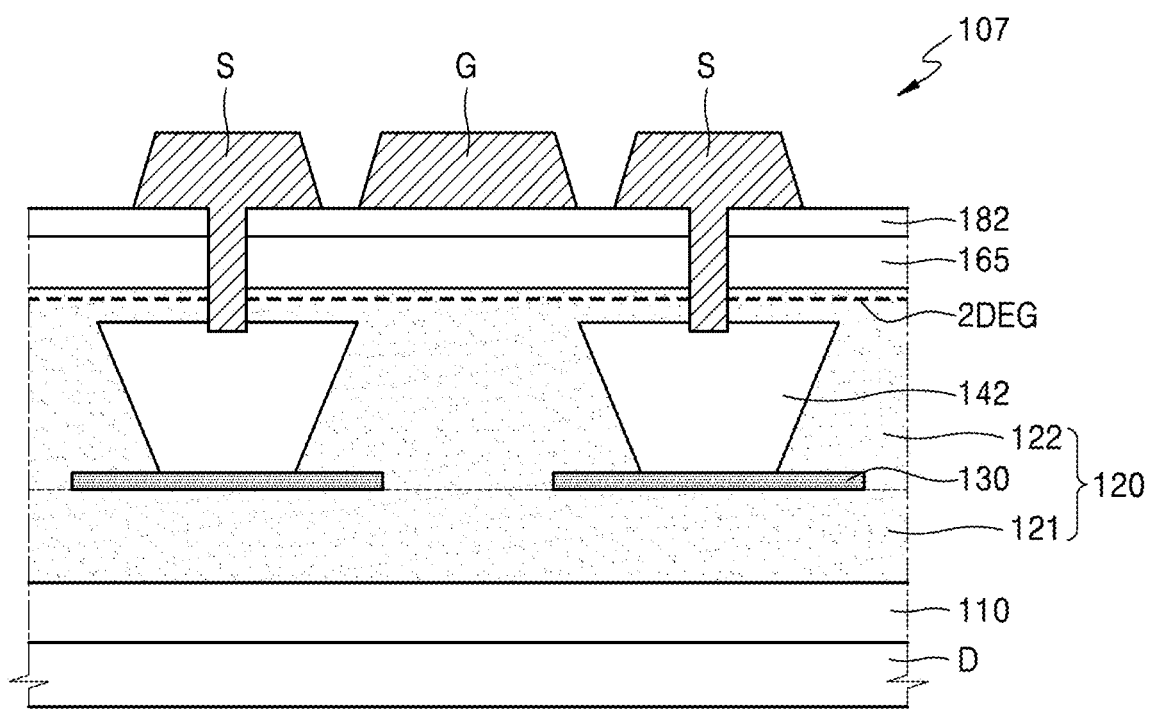
FIG. 22 is a schematic cross-sectional view illustrating a structure of a transistor according to another embodiment.

In the transistor 102 of FIG. 4, a concept that a PN junction structure is formed in the horizontal direction by the channel region 142 and the second drift region 122 is applied to a basic structure of a high electron mobility transistor (HEMT) used as a power device, and this structure may be modified in various ways. For example, a gate insulating layer 180 (as depicted in FIG. 21) and/or a depletion layer (a p-type semiconductor layer such as p-type GaN but limited thereto, as depicted in FIG. 22) may be further provided between the gate electrode G and the 2DEG induction layer 165. In addition, a recessed region (not shown) may be formed by recessing a portion of the 2DEG induction layer 165 in which the gate electrode G is to be formed to a certain depth and thereafter the gate electrode G may be formed in the recess region. In this case, characteristics of the 2DEG layer corresponding to the recessed region may change and characteristics of the HEMT may be adjusted. In addition, various modifications may be made within a range in which the source electrode S and the drain electrode D are arranged vertically.

Figure 5:
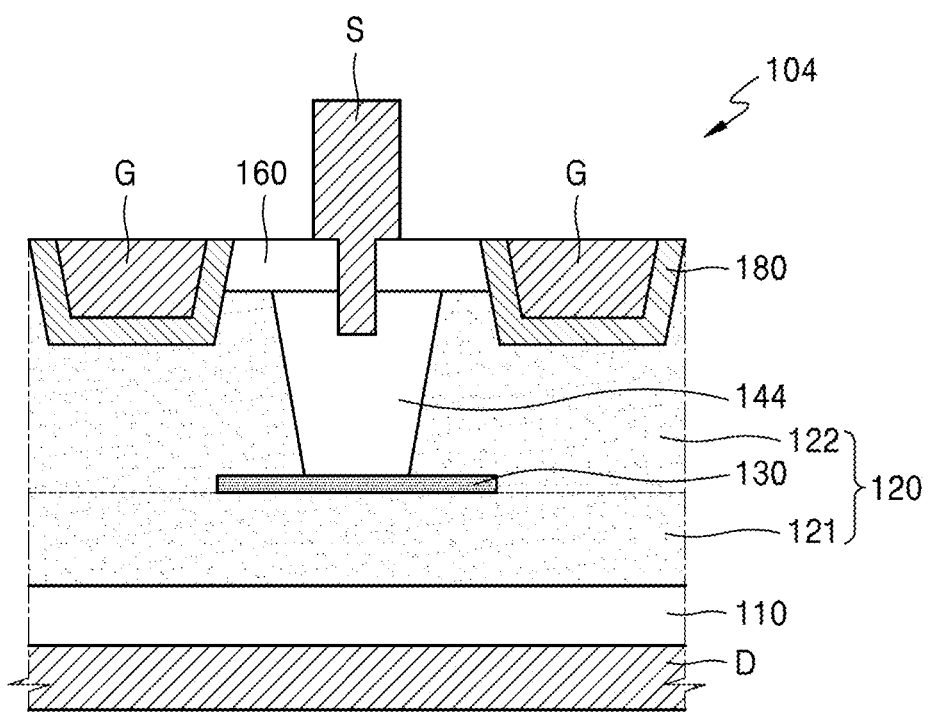
FIG. 5 is a schematic cross-sectional view illustrating a structure of a transistor according to another embodiment.

FIG. 5 is a schematic cross-sectional view illustrating a structure of a transistor according to another embodiment.

A transistor 104 of the present embodiment is different from the above-described transistors 101 and 102 in that it has a Fin-FET structure.

The transistor 104 includes a drain electrode D, at least one mask layer 130 disposed apart from the drain electrode D in a first direction (a Z-axis direction, a first drift region 121 of a first conductivity type between the drain electrode D and the at least one mask layer 130, a channel region 144 of a second conductivity type on the at least one mask layer 130, a second drift region 122 provided on the first drift region 121 to be adjacent to the channel region 144, a source electrode S on the channel region 144, and a gate electrode G on the second drift region 122. In addition, a drain region 110 doped with a dopant of a first conductivity type in a high concentration may be further provided between the drain electrode D and the first drift region 121, and a source region 160 doped with a dopant of a first conductivity type in a high concentration may be further provided between the source electrode S an the channel region 144.

The source electrode S may be formed in direct contact with the channel region 144 and have a shape passing through the source region 160 to extend into the inside of the channel region 144 as shown in the drawing. The source electrode S and the gate electrode G are repeatedly and alternately stacked in a fin form.

FIGS. 6 to 14 are diagrams illustrating a method of manufacturing a transistor according to an embodiment.

Figure 6:
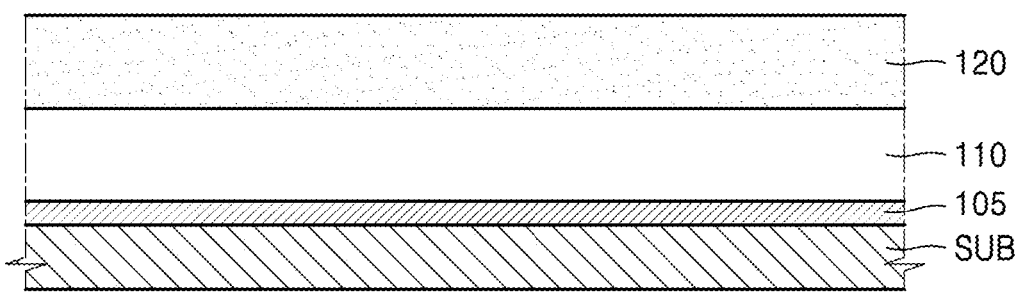
FIGS. 6 to 14 are diagrams illustrating a method of manufacturing a transistor according to an embodiment.

Referring to FIG. 6, a first drift region 121 is formed on a substrate SUB. Before forming the first drift region 121, a high-concentration drain region 110 may be formed. To form the drain region 110, first, a buffer layer 105 may be formed on the substrate SUB. The first drift region 121 may be formed in direct contact with the drain region 110.

A sapphire ($Al_2O_3$) substrate, a silicon (Si) substrate, a silicon carbide (SiC) substrate, a metal substrate, a GaN substrate, or the like may be used as the substrate SUB. When the substrate SUB is formed of a metal material, the substrate SUB may be used as a drain electrode. In other cases, the substrate SUB may be removed and a drain electrode may be formed below the drain region 110.

The buffer layer 105 is employed to mitigate the occurrence of defects, cracks, stress, etc. due to a lattice constant mismatch or a thermal expansion coefficient mismatch between semiconductor materials of the substrate SUB and the drain region 110 and to obtain a high-quality semiconductor layer. The buffer layer 105 is illustrated as a single layer but is not limited thereto and may have a multilayer structure. A material and structure of the buffer layer 105 may be determined in consideration of a material of the substrate SUB and the semiconductor material used to form the drain region 110.

The drain region 110 and the first drift region 121 include a semiconductor material doped with a dopant of a first conductivity type. The drain region 110 and the first drift region 121 may include a Group III-V compound semiconductor and be grown by an epitaxial growth process. The epitaxial growth process may include a metal organic chemical vapor deposition process, a liquid phase epitaxy process, a hydride vapor phase epitaxy process, a molecular beam epitaxy process, or a metal organic vapor phase epitaxy growth process. Silicon (Si) may be used as the dopant of the first conductivity type.

The drain region 110 may be more heavily doped than the first drift region 121. The drain region 110 may be doped at a doping concentration of $110^{19}/cm^3$ or more. The first drift region 121 may be doped at a doping concentration of $10^{15}/cm^3$ to $10^{18}/cm^3$. The first drift region 121 may be doped at a doping concentration of $10^{17}/cm^3$ to $10^{18}/cm^3$.

Figure 7:
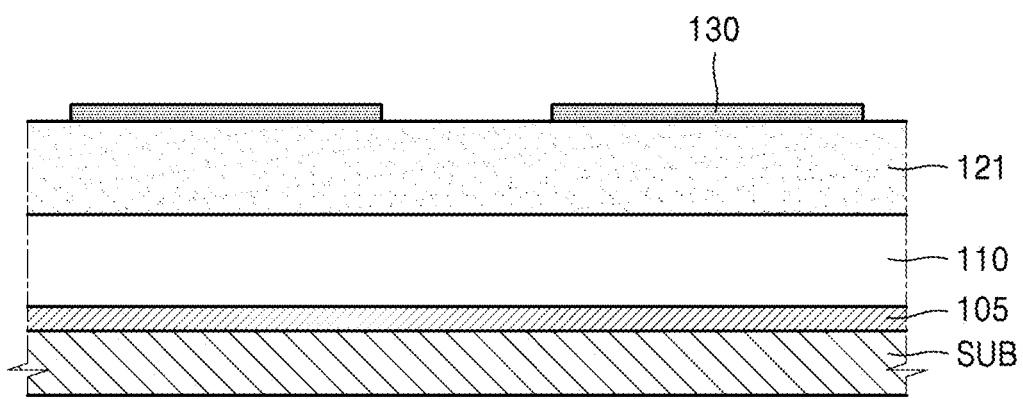

Referring to FIG. 7, a mask layer 130 is formed on the first drift region 121. One or more mask layers 130 may be formed to cover a portion of a surface of the first drift region 121. The mask layer 130 may include an insulating material that limits and/or suppresses growth of a semiconductor, and may include, for example, various types of oxides and nitrides. The at least one mask layer 130 may include $SiO_2$, $SiN_x$ or $Al_2O_3$. The mask layer 130 may be formed by a chemical vapor deposition (CVD) process, a physical vapor deposition (PVD) process, or an atomic layer deposition (ALD) process.

Figure 8:
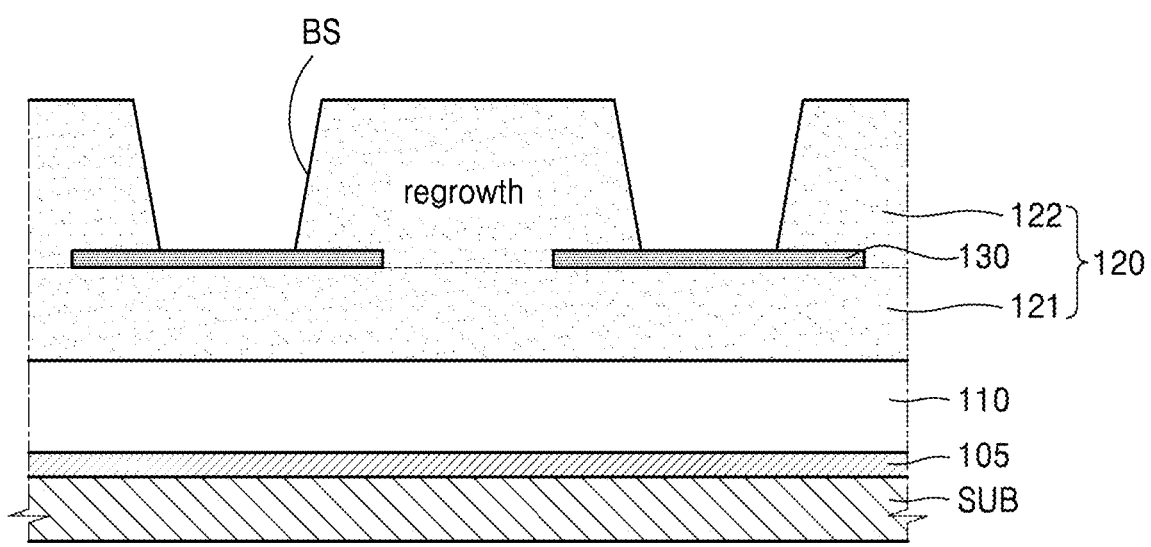

Next, referring to FIG. 8, a second drift region 122 is formed by growing a semiconductor on a region of a surface of the first drift region 121 not covered with the mask layer 130. The second drift region 122 is on the first drift region 121. The second drift region 122 may include a semiconductor having the same composition as that of the first drift region 121 and may be grown by one of the various epitaxial growth methods described above.

As illustrated in the drawing, the second drift region 122 is vertically grown from the region of the surface of the first drift region 121 not covered with the mask layer 130 and also grown horizontally toward an upper region of the mask layer 130. Accordingly, the second drift region 122 may be formed on the mask layer 130 to have a shape with an oblique boundary surface BS. The boundary surface BS may be a PN-junction surface.

Figure 9:
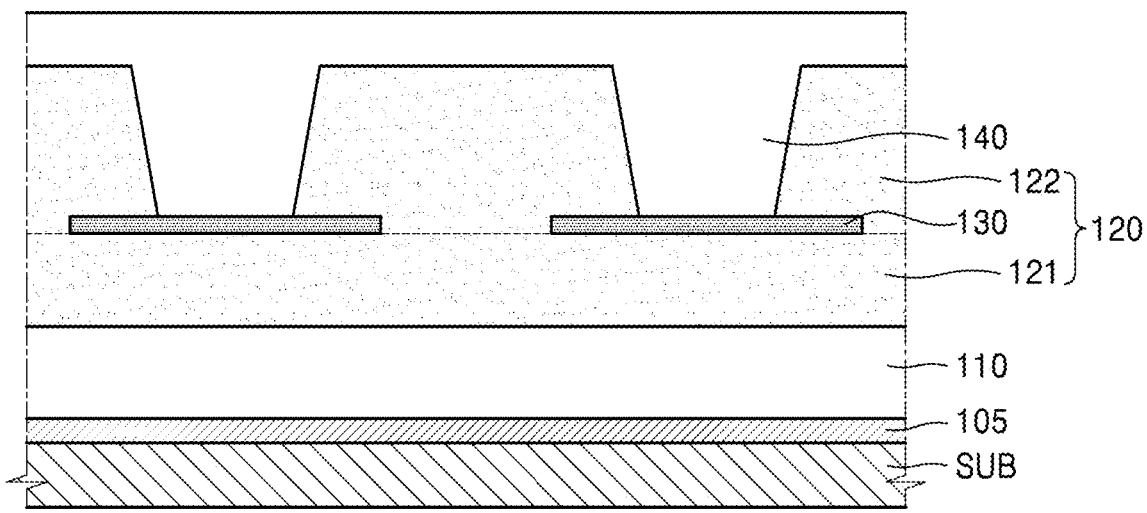

Referring to FIG. 9, a channel material layer 140 for a channel region is formed on the mask layer 130. The channel material layer 140 may be formed by growing a semiconductor from the second drift region 122. The channel material layer 140 may be formed to cover an entire region of the surface of the mask layer 130 not covered with the first drift region 121.

The channel material layer 140 may include a semiconductor doped with a dopant of a second conductivity type. The channel material layer 140 may be formed by one of the various epitaxial growth methods described above. Magnesium (Mg) may be used as the dopant of the second conductivity type.

Figure 10:
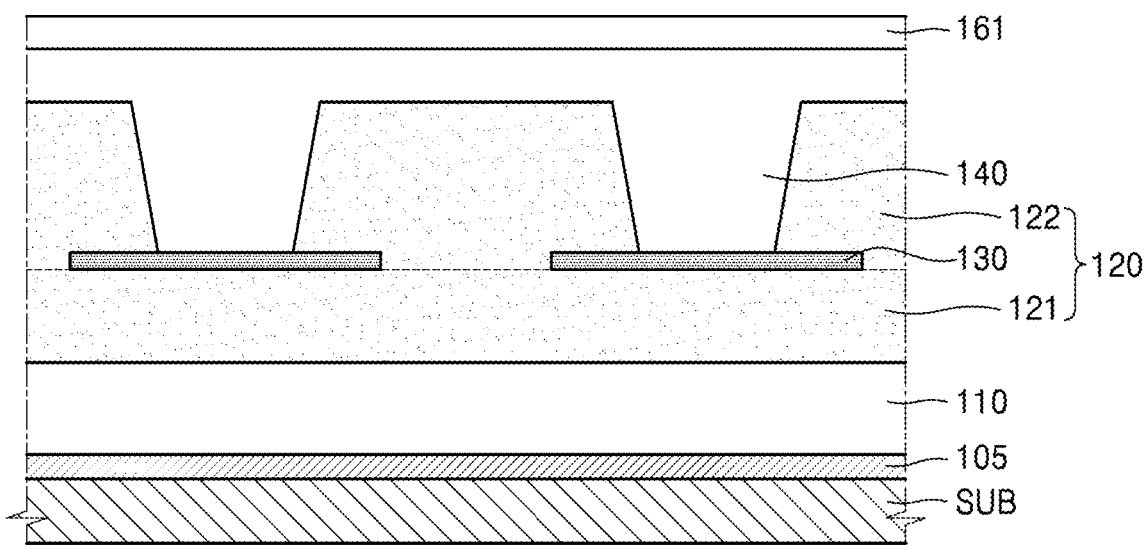

Referring to FIG. 10, a source region layer 161 is formed on the channel material layer 140. The source region layer 161 may include a semiconductor doped with the dopant of the first conductivity type at a high concentration. The doping concentration may be $10^{19}/cm^3$ or more.

Figure 11:
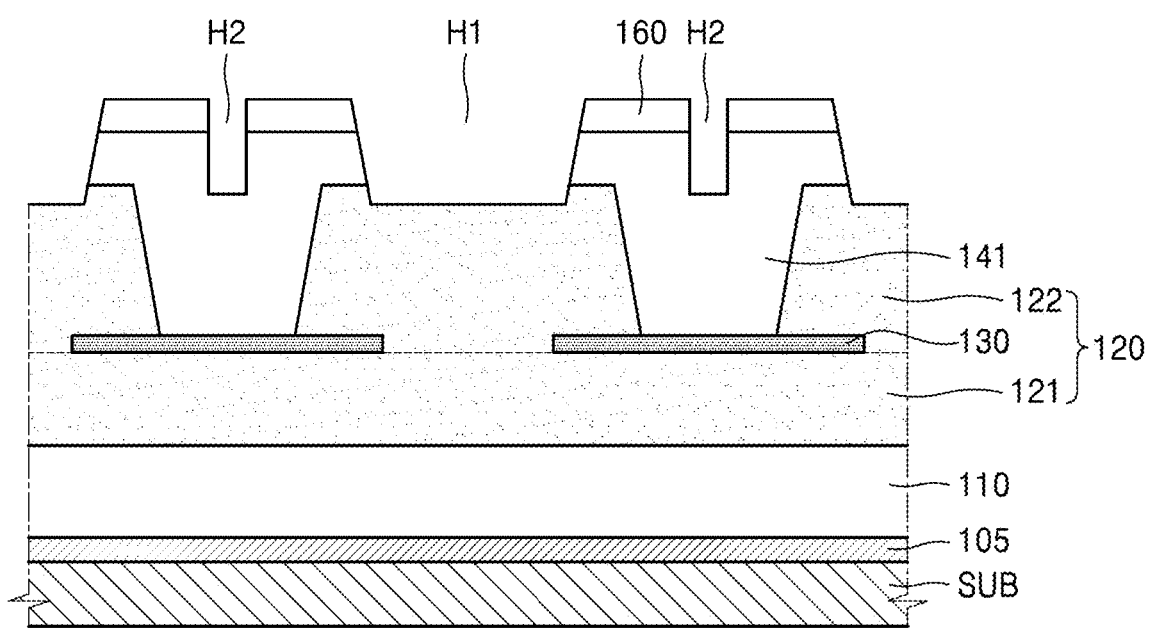

Referring to FIG. 11, the source region layer 161 and the channel material layer 140 are etched in a certain pattern to form a plurality of trenches to a certain depth, and a source region 160 and a channel region 141 are formed. A trench H1 is formed to form a gate electrode, and is formed to a depth sufficient to pass through the source region 160 and the channel region 141 and expose a surface of the second drift region 122. A trench H2 is formed to form a source electrode, and is formed to a depth sufficient to pass through the source region 160 and expose a surface of the channel region 141. The trench H2 may be formed to a certain depth into the channel region 141 but is not limited thereto, and the depth of the trench H2 may fall within a range in which the source electrode formed therein may be in direct contact with the channel region 141.

Figure 12:
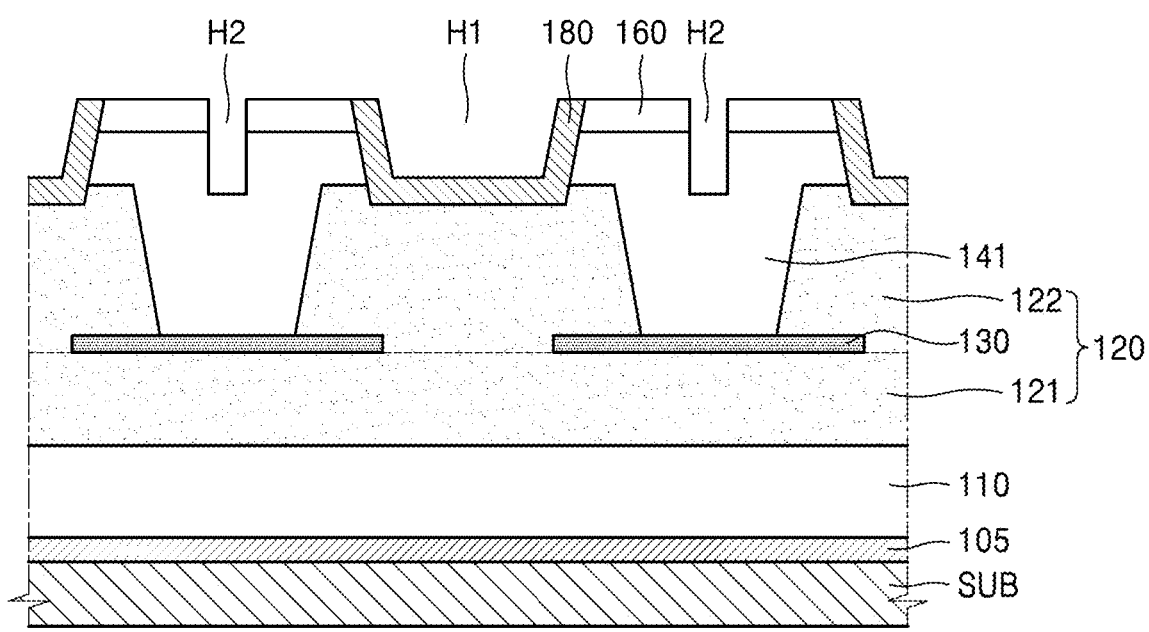

Next, referring to FIG. 12, a gate insulating film 180 is formed on an inner surface of the trench H1. The gate insulating film 180 is to insulate the gate electrode from the channel region 141 and the source region 160. The gate insulating film 180 may be formed of silicon nitride (SiN), silicon oxide (SiO$_2$), silicon oxynitride (SiON), aluminum nitride (AlN), aluminum oxide (Al$_2$O$_3$), aluminum oxynitride (AlON), tantalum oxide ((HfO$_2$), hafnium oxide (HfO$_2$) or other various high-K dielectric materials. The mask layer 130 may be formed by a chemical vapor deposition (CVD) process, a physical vapor deposition (PVD) process, or an atomic layer deposition (ALD) process.

Figure 13:
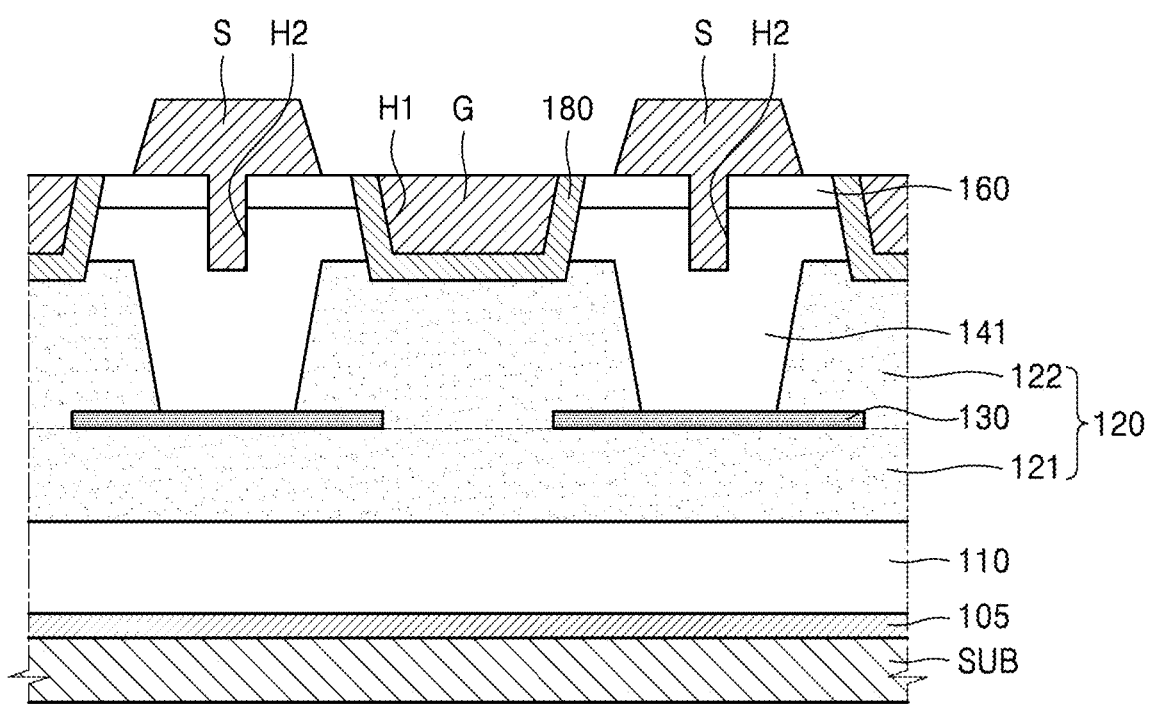

Referring to FIG. 13, an electrode material is applied into the trench H1 and the trench H2 to form a source electrode S and a gate electrode G. The source electrode S and the gate electrode G may be formed of a metal, an alloy, a conductive metal oxide, or a conductive metal nitride.

Figure 14:
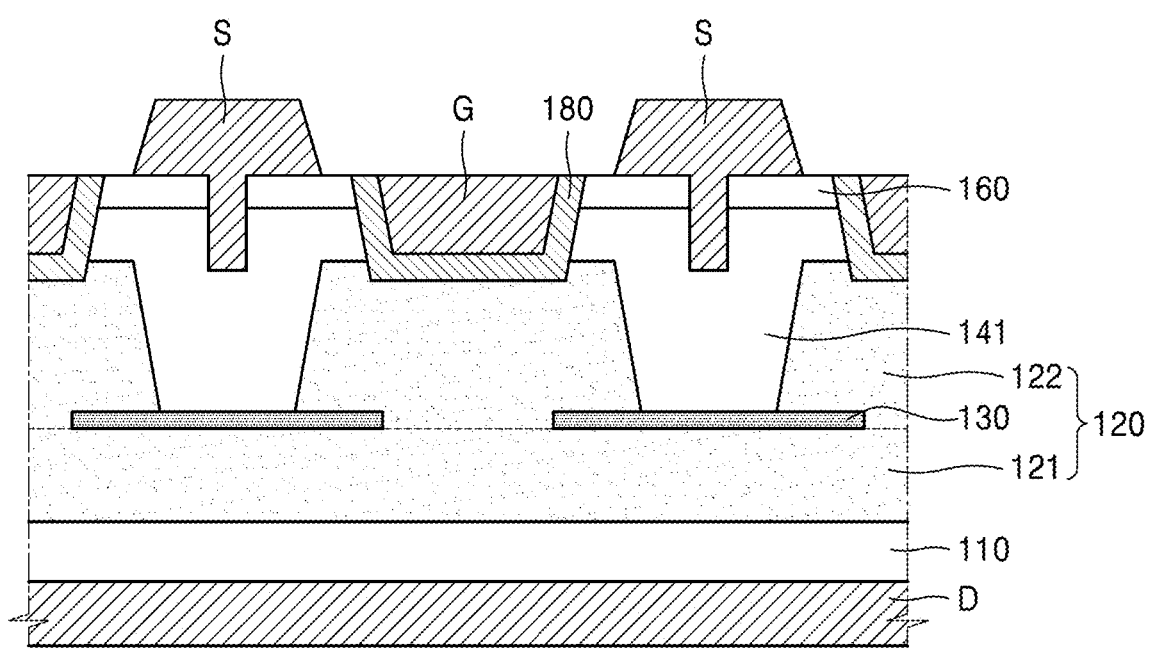

Referring to FIG. 14, the substrate SUB and the buffer layer 105 are removed, and a drain electrode D is formed on a lower surface of the drain region 110.

The substrate SUB and the buffer layer 105 may be removed by, for example, a laser lift-off method.

According to the above process, a transistor having a trench MOSFET structure as illustrated in FIG. 2 may be manufactured.

FIGS. 15 to 20 are diagrams illustrating a method of manufacturing a transistor according to another embodiment.

The method of manufacturing a transistor according to the present embodiment may be substantially the same as, for example, the method of manufacturing a transistor of FIG. 4.

Figure 15:
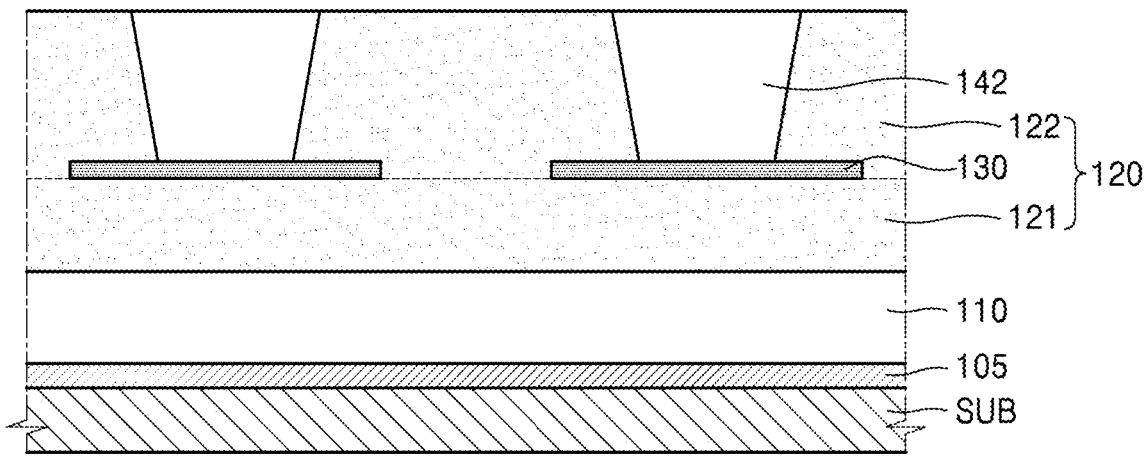
FIGS. 15 to 20 are diagrams illustrating a method of manufacturing a transistor according to another embodiment.

A structure of FIG. 15 may be obtained by adding an etching and/or a planarization process to a structure manufactured according to the operation of FIGS. 6 to 9. That is, a channel region 142 may be formed by etching an upper portion of the channel layer 140 of the structure of FIG. 9.

Figure 16:
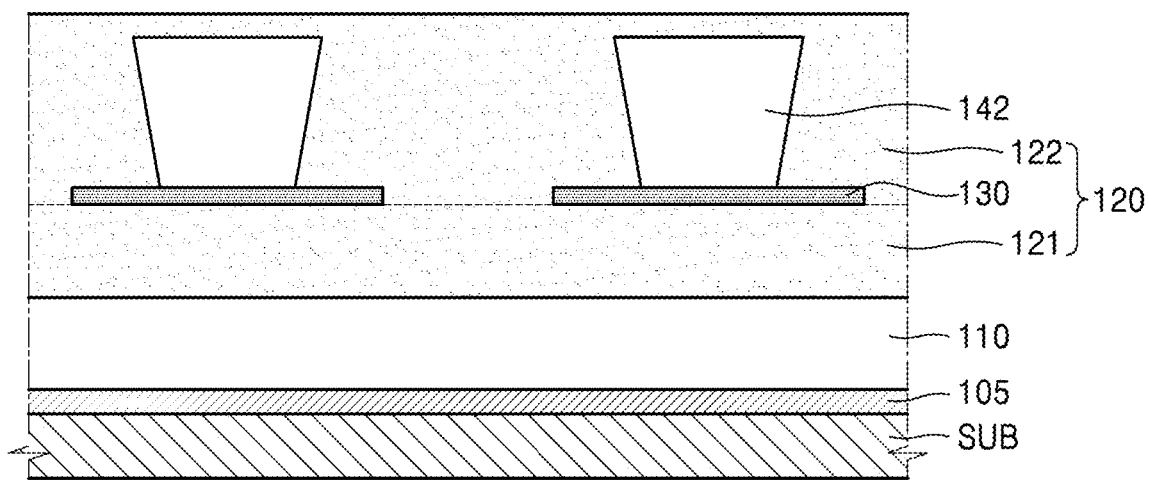

Next, referring to FIG. 16, a second drift region 122 is additionally grown on the channel region 142 to cover an upper portion of the channel region 142.

Figure 17:
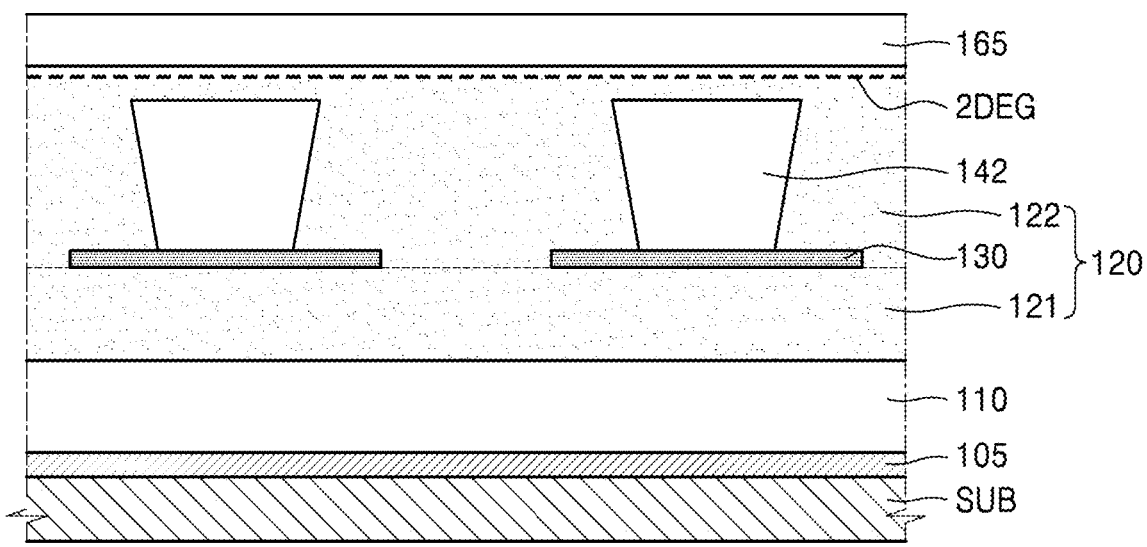

Referring to FIG. 17, a 2DEG induction layer 165 is formed on the second drift region 122.

Figure 18:
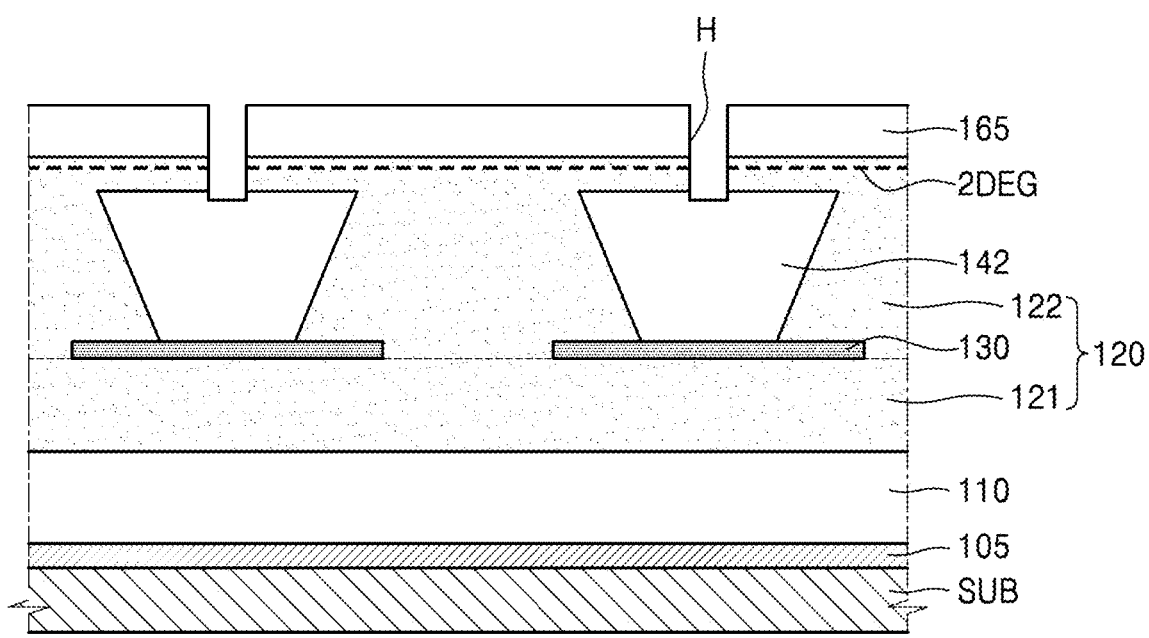

Referring to FIG. 18, a trench H is formed pass through the 2DEG induction layer 165 and the second drift region 122. The trench H is for forming a source electrode, and a depth of the trench H may extend to a certain depth inside the channel region 142, as shown in the drawing. However, the trench H is not limited thereto and may be formed to various depths to cause the source electrode formed in the trench H to be in direct contact with the channel region 142.

Figure 19:
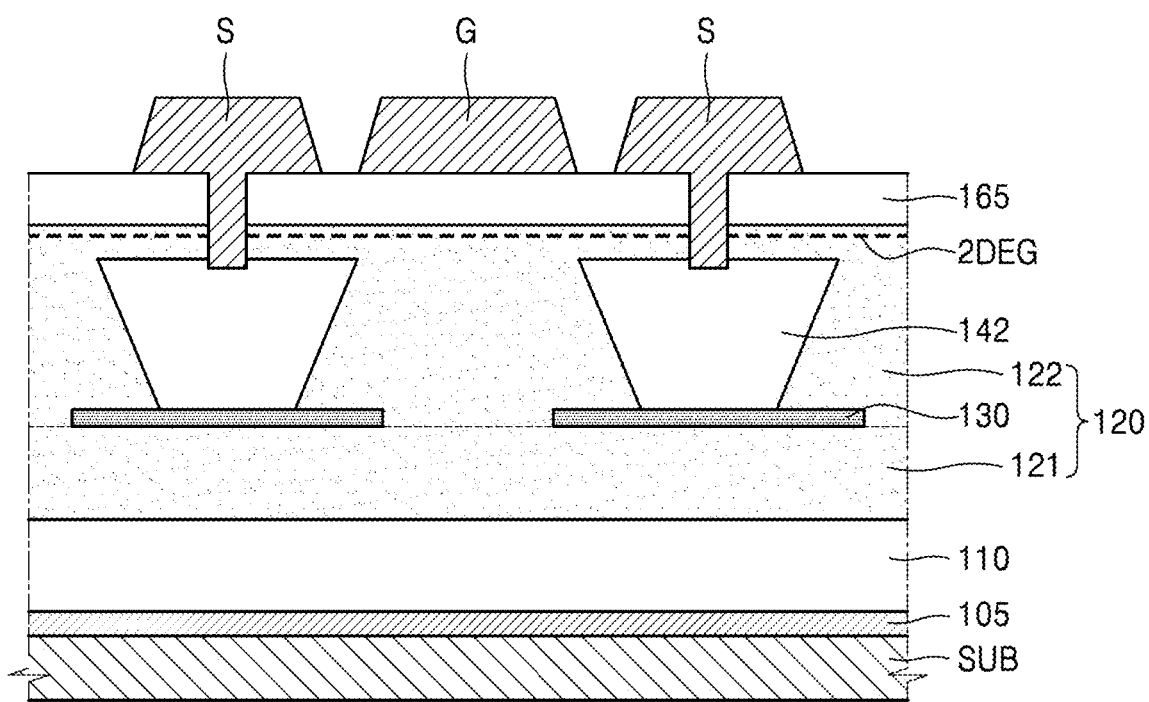

Referring to FIG. 19, a source electrode S and a gate electrode G are formed on the 2DEG induction layer 165. The source electrode S may be formed to pass through the 2DEG induction layer 165 to be in direct contact with the channel region 142.

Figure 20:
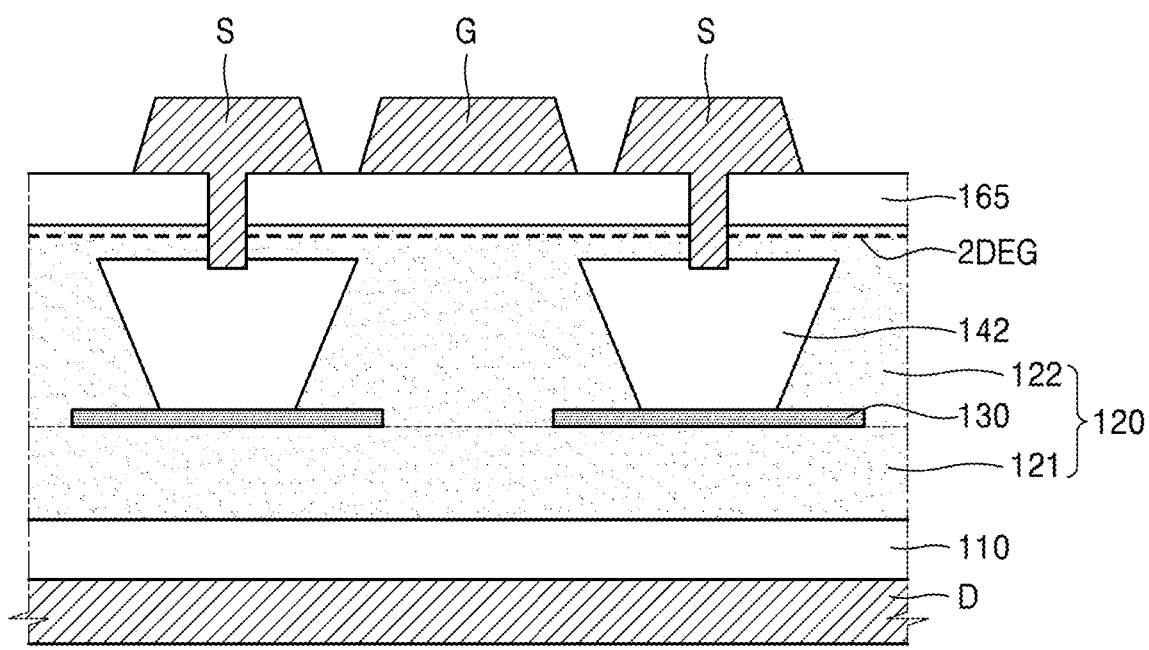

Referring to FIG. 20, a substrate SUB and a buffer layer 105 are removed and a drain electrode D is formed on a lower surface of the drain region 110 to manufacture a transistor having the structure illustrated in FIG. 4.

The semiconductor structure, the transistors using the same, and the method of manufacturing a transistor described above have been described above with reference to the embodiments illustrated in the drawings but are only examples and it will be understood by those of ordinary skill in the art that various modifications and equivalent embodiments may be made. While many matters have been described above in detail, they should be construed as illustrative of certain embodiments rather than limiting the scope of the present disclosure. Therefore, the scope of the present disclosure should be determined not by the embodiments set forth herein but by the technical spirit described in the claims.

The transistors described above are vertical transistors with a horizontal PN-junction structure and are capable of effectively lowering an on-resistance Ron thereof while increasing withstanding voltage.

The above-described transistors are thus applicable to various types of high power devices and electronic devices including the same.

Figure 23:
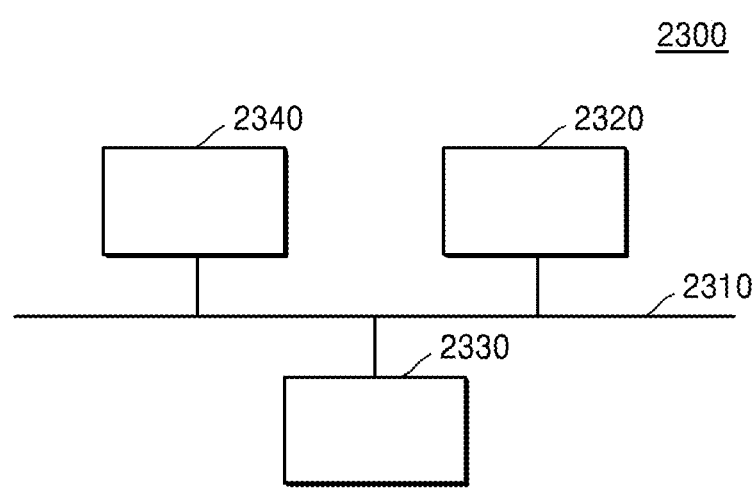
FIG. 23 is a schematic of an electronic device according to another embodiment.

FIG. 23 is a schematic of an electronic device according to another embodiment.

As shown, the electronic device 2300 includes one or more electronic device components, including a processor (e.g., processing circuitry) 2320 and a memory 2330 that are communicatively coupled together via a bus 2310.

The processing circuitry 2320, may be included in, may include, and/or may be implemented by one or more instances of processing circuitry such as hardware including logic circuits, a hardware/software combination such as a processor executing software; or a combination thereof. For example, the processing circuitry 2320 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 2330 may include a non-transitory computer readable storage device, for example a solid state drive (SSD), storing a program of instructions, and the processing circuitry 2320 may be configured to execute the program of instructions to implement the functionality of the electronic device 2300.

In some example embodiments, the electronic device 2300 may include one or more additional components 2340, coupled to bus 2310, which may include, for example, a power supply, a light sensor, a light-emitting device, any combination thereof, or the like. In some example embodiments, one or more of the processing circuitry 2320, memory 2330, or one or more additional components 2340 may include any semiconductor structure or transistor according to any of the example embodiments described herein, such as the semiconductor structure 100 in FIG. 1 or the transistors 101 to 107 described above in FIGS. 2, 4-6, and 21-22, such that the one or more of the processing circuitry 2320, memory 2330, or one or more additional components 2340, and thus, the electronic device 2300, may have a power device capable of capable of effectively lowering an on-resistance Ron thereof while increasing withstanding voltage, and thus providing an electronic device 2300 having improved electrical characteristics and thus improved performance and/or reliability.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor structure comprising:
   a substrate;
   at least one mask layer spaced apart from the substrate in a first direction;

a first semiconductor region of a first conductivity type between the substrate and the at least one mask layer;
a second semiconductor region of a second conductivity type disposed on the at least one mask layer; and
a third semiconductor region of the first conductivity type on the first semiconductor region, the third semiconductor region contacting the second semiconductor region to form a PN-junction structure in a second direction different from the first direction, a portion of the third semiconductor region disposed between the second semiconductor region and the at least one mask layer in the first direction.

2. The semiconductor structure of claim 1, wherein the third semiconductor region extends in the first direction from a region of a surface of the first semiconductor region not covered with the at least one mask layer toward an upper region of the at least one mask layer.

3. The semiconductor structure of claim 1, wherein the second semiconductor region contacts the at least one mask layer.

4. The semiconductor structure of claim 1, wherein the at least one mask layer includes an insulating material and is configured to suppress growth of a semiconductor.

5. The semiconductor structure of claim 1, further comprising:
a high-concentration layer between the substrate and the first semiconductor region, wherein
the high-concentration layer is doped more heavily than the first semiconductor region.

6. The semiconductor structure of claim 1, wherein
the first semiconductor region, the second semiconductor region, and the third semiconductor region includes a Group III-V compound semiconductor, and
the Group III-V compound semiconductor includes at least one element of boron (B), aluminum (Al), gallium (Ga), or indium (In) as a Group III, element, and
the Group III-V compound semiconductor includes nitrogen as a Group V element.

7. The semiconductor structure of claim 1, wherein the first semiconductor region and the third semiconductor region include a compound semiconductor and have a same composition.

8. A transistor comprising:
a drain electrode;
at least one mask layer spaced apart from the drain electrode in a first direction;
a first drift region of a first conductivity type between the drain electrode and the at least one mask layer;
a channel region of a second conductivity type on the at least one mask layer;
a second drift region on the first drift region, the second drift region contacting the channel region to form a PN-junction structure in a second direction different from the first direction;
a source electrode on the channel region; and
a gate electrode on the second drift region,
wherein a thickness of the second drift region is greater than a thickness of the first drift region.

9. The transistor of claim 8, wherein the second drift region extends in the second direction over an upper region of the at least one mask layer, from a region of a surface of the first drift region not covered by the at least one mask layer.

10. The transistor of claim 8, wherein the channel region contacts the at least one mask layer.

11. The transistor of claim 8, wherein the at least one mask layer includes an insulating material and is configured to suppress growth of a semiconductor.

12. The transistor of claim 8, further comprising:
a drain region between the drain electrode and the first drift region, wherein
the drain region is doped with a dopant of a first conductivity type at a high concentration.

13. The transistor of claim 12, wherein the drain region directly contacts the first drift region.

14. The transistor of claim 8, wherein
the first drift region, the channel region, and the second drift region include a Group III-V compound semiconductor,
the Group III-V compound semiconductor includes at least one element of boron (B), aluminum (Al), gallium (Ga), or indium (In) as a Group III element, and
the Group III-V compound semiconductor includes nitrogen as a Group V element.

15. The transistor of claim 8, wherein the source electrode directly contacts the channel region.

16. The transistor of claim 8, further comprising:
a gate insulating film surrounding the gate electrode to insulate the gate electrode from the channel region and the second drift region, wherein
the gate electrode is adjacent to the channel region and the second drift region.

17. The transistor of claim 8, further comprising:
a two-dimensional electron gas (2DEG) induction layer configured to induce a two-dimensional electron gas layer in the second drift region,
the 2DEG induction layer being provided between the second drift region and the source electrode, and
the 2DEG induction layer being formed of a semiconductor material of a composition different from that of a semiconductor material of the second drift region.

18. The transistor of claim 17, wherein the source electrode has a shape in which one end region thereof passes through the 2DEG induction layer and directly contacts the channel region.

19. The transistor of claim 18, wherein the source electrode has a shape in which one end region thereof passes through the 2DEG induction layer to extend into the channel region.

20. The transistor of claim 8, wherein a length of the PN-junction structure is greater than the thickness of the first drift region.

21. A transistor comprising:
a drain electrode;
at least one mask layer spaced apart from the drain electrode in a first direction;
a first drift region of a first conductivity type between the drain electrode and the at least one mask layer;
a channel region of a second conductivity type on the at least one mask layer;
a second drift region on the first drift region, the second drift region contacting the channel region to form a PN-junction structure in a second direction different from the first direction;
a source electrode on the channel region;
a source region provided between the channel region and the source electrode, wherein
the source region is doped with a dopant of a first conductivity type at a high concentration; and
a gate electrode on the second drift region.

22. The transistor of claim 21, wherein the source electrode has a shape in which one end region thereof passes through the source region and directly contacts the channel region.

23. The transistor of claim 22, wherein the source electrode has a shape in which one end region thereof passes through the source region and extends into the channel region.

24. A method of manufacturing a transistor, the method comprising:
   forming a first drift region of a first conductivity type on a substrate;
   forming at least one mask layer on the first drift region;
   forming a second drift region by growing a semiconductor from a region of a surface of the first drift region not covered by the at least one mask layer;
   forming a channel region of a second conductivity type on the at least one mask layer, the channel region arranged such that a portion of the second drift region is between the channel region and the at least one mask layer in a first direction;
   forming a source electrode on the channel region;
   forming a gate electrode on the second drift region; and
   forming a drain electrode below the first drift region.

25. The method of claim 24, further comprising,
   before forming the first drift region on the substrate,
   forming a drain region doped with a dopant of the first conductivity type at a high concentration on the substrate.

26. The method of claim 25, wherein the forming of the first drift region includes forming the first drift region in direct contact with the drain region.

27. The method of claim 24, wherein the forming the channel region includes forming the channel region to cover an entire region of the surface of the first drift region not covered by the at least one mask layer.

28. The method of claim 24, wherein the forming the source electrode includes forming the source electrode in direct contact with the channel region.

* * * * *